US012729434B2

(12) United States Patent
Kim et al.

(10) Patent No.: US 12,729,434 B2
(45) **Date of Patent: *Sep. 8, 2026**

(54) METHOD FOR FILLING A GAP IN A THREE-DIMENSIONAL STRUCTURE ON A SEMICONDUCTOR SUBSTRATE

(71) Applicant: ASM IP Holding B.V., Almere (NL)

(72) Inventors: KiKang Kim, Yongin-si (KR); Hak-Yong Kwon, Yongin-si (KR); HieChul Kim, Hwaseong-si (KR); SungKyu Kang, Hwaseong-si (KR); SeungHwan Lee, Anseong-si (KR); SungBae Kim, Yongin-si (KR); JongHyun Ahn, Hwaseong-si (KR); SeongRyeong Kim, Hwaseong-si (KR); KyuMin Kim, Anyang-si (KR); YoungMin Kim, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/378,403

(22) Filed: Oct. 10, 2023

(65) Prior Publication Data

US 2024/0043997 A1 Feb. 8, 2024

Related U.S. Application Data

(63) Continuation of application No. 17/236,782, filed on Apr. 21, 2021, now Pat. No. 11,814,728.

(Continued)

(51) Int. Cl.
*C23C 16/455* (2006.01)
*C23C 16/56* (2006.01)

(Continued)

(52) U.S. Cl.
CPC ........ *C23C 16/45536* (2013.01); *C23C 16/56* (2013.01); *H10P 14/6339* (2026.01); *H10P 50/242* (2026.01)

(58) Field of Classification Search
None
See application file for complete search history.

(56) References Cited

U.S. PATENT DOCUMENTS 7,651,955 B2 1/2010 Ranish et al.
9,627,221 B1 * 4/2017 Zaitsu ................ C23C 16/4554

(Continued)

OTHER PUBLICATIONS

Wikipedia, "Nitrous oxide" via https://en.wikipedia.org/wiki/Nitrous_oxide ; pp. 1-29 (Year: 2024).*

*Primary Examiner* — Binh X Tran
(74) *Attorney, Agent, or Firm* — Snell & Wilmer L.L.P.

(57) ABSTRACT

This application relates to a method of filling a gap in a three-dimensional structure over a semiconductor substrate. The method may include depositing a thin film at least on a three-dimensional structure over a substrate using at least one reaction gas activated with a first radio frequency (RF) power having a first frequency, the three dimensional structure comprising a trench and/or hole. The method may also include etching the deposited thin film using at least one etchant activated with a second RF power having a second frequency lower than the first frequency. The method may further include repeating a cycle of the depositing and the etching at least once until the trench and/or hole are filled with the thin film. According to some embodiments, a thin film having substantially free of voids and/or seams can be formed in the three-dimensional structure.

20 Claims, 17 Drawing Sheets

Related U.S. Application Data

(60) Provisional application No. 63/014,916, filed on Apr. 24, 2020.

(51) Int. Cl.
*H10P 14/60* (2026.01)
*H10P 50/24* (2026.01)

(56) References Cited

U.S. PATENT DOCUMENTS

| | | | | |
|---|---|---|---|---|
| 10,269,559 | B2 | 4/2019 | Abel et al. | |
| 11,062,939 | B2 | 7/2021 | Gottheim et al. | |
| 11,814,728 | B2* | 11/2023 | Kim | C23C 16/45536 |
| 2003/0215570 | A1 | 11/2003 | Seutter et al. | |
| 2004/0079632 | A1 | 4/2004 | Ahmad et al. | |
| 2007/0059900 | A1 | 3/2007 | Lai et al. | |
| 2008/0142483 | A1 | 6/2008 | Hua et al. | |
| 2014/0124726 | A1 | 5/2014 | Oh | |
| 2014/0273527 | A1 | 9/2014 | Niskanen et al. | |
| 2017/0040214 | A1* | 2/2017 | Lai | H01L 21/76877 |
| 2018/0061628 | A1* | 3/2018 | Ou | H01L 21/32 |
| 2018/0061663 | A1* | 3/2018 | Chandrashekar | H01L 21/32136 |
| 2019/0055645 | A1* | 2/2019 | Li | C23C 16/045 |
| 2019/0080903 | A1* | 3/2019 | Abel | H10P 14/69215 |
| 2020/0017967 | A1* | 1/2020 | Abel | H01L 21/0228 |
| 2021/0082667 | A1* | 3/2021 | Zhao | H01L 21/31116 |

* cited by examiner 1217
1210
1216
1220
1230
1240
1214
1212

| | Remaining $SiO_2$ Film Thickness(nm) | |
|---|---|---|
| RF Frequency | 430KHz | 27.12MHz |
| Top Edge | 13.4 nm | 27.2 nm |
| Trench Top | 12.3 nm | 20.0 nm |
| Trench Middle | 15.2 nm | 18.6 nm |
| Trench Middle-Low | 17.7 nm | 23.3 nm |

FIG. 12

METHOD FOR FILLING A GAP IN A THREE-DIMENSIONAL STRUCTURE ON A SEMICONDUCTOR SUBSTRATE

REFERENCE TO RELATED APPLICATION

This application is a continuation of, and claims priority to, U.S. application Ser. No. 17/236,782 filed Apr. 21, 2021 titled METHOD FOR FILLING A GAP IN A THREE-DIMENSIONAL STRUCTURE ON A SEMICONDUCTOR SUBSTRATE; which claims priority to U.S. Patent Provisional Application No. 63/014,916, filed on Apr. 24, 2020, the disclosures of which are hereby incorporated by reference in their entirety.

BACKGROUND

Field

The present disclosure relates generally to the field of semiconductor device manufacturing and, more particularly, to methods for filling a gap in a three-dimensional structure such as a trench or hole on a semiconductor substrate.

Description of the Related Art

Deposition of a thin film within a high aspect ratio trench or hole is useful in the field of semiconductor fabrication, for example in gap filling processes. Using methods such as atomic layer deposition (ALD), plasma enhanced atomic layer deposition (PEALD), chemical vapor deposition (CVD), plasma enhanced chemical vapor deposition (PECVD), a thin film can be deposited directly in three-dimensional (3D) structures, such as within a high aspect ratio hole. It has been noted that in depositing thin film in high aspect ratio structures, an overhang or protruded portion may be formed at least on an upper portion of the trench or hole. Thus, the upper portion of the trench or hole might be filled first with the thin film and the gap of the trench is closed from the top, causing some voids and/or seams formed in the middle portion of the trench. Similarly, in the situation where the trench has a negative slope with a smaller width at an upper portion and larger width at a lower portion of the trench, the upper portion of the trench might also be filled first with the thin film and the gap of the trench is closed from the top, causing some voids and/or seams formed in the middle portion of the trench.

SUMMARY

For purposes of summarizing the described technology and the advantages achieved over the prior art, certain objects and advantages of the described technology are described herein. Not all such objects or advantages may be achieved in any particular embodiment of the described technology. Thus, for example, those skilled in the art will recognize that the described technology may be embodied or carried out in a manner that achieves or optimizes one advantage or group of advantages as taught herein without necessarily achieving other objects or advantages as may be taught or suggested herein.

One aspect is a method of filling a gap in a three dimensional structure on a semiconductor substrate, the method comprising: depositing a thin film on the three dimensional structure using at least one reaction gas activated with a first radio frequency (RF) power having a first frequency, the three dimensional structure comprising a trench and/or hole; and etching the deposited thin film using at least one etchant activated with a second RF power having a second frequency lower than the first frequency.

The above method further comprises repeating a cycle of the depositing and the etching at least once until the trench and/or hole are filled with the thin film. In the above method, the reaction gas comprises oxygen. In the above method, the reaction gas comprises at least one of $O_2$, $O_3$, $H_2O$, $NO_2$, $N_2O$, or a combination thereof. In the above method, the first frequency is in a range of about 100 kHz to about 3,000 MHz. In the above method, the first frequency is in a range of about 27.12 MHz to about 100 MHz. In the above method, the first RF power is in a range of about 100 watts to about 20,000 watts. In the above method, the first RF power is in a range of about 500 watts to about 3,000 watts.

In the above method, the second frequency is in a range of about 3 kHz to about 13,560 kHz. In the above method, the second frequency is in a range of about 100 kHz to about 5,000 kHz. In the above method, the second RF Power is in a range of about 100 watts to about 500 watts. In the above method, the first frequency is in a range of about 27.12 MHz to about 100 MHz, and wherein the second frequency is in a range of about 100 kHz to about 5,000 kHz. In the above method, the etchant comprises fluorine. In the above method, the etchant comprises at least one of $NF_3$, $ClF_3$, $F_2$, $SF_6$, $CF_4$, or a combination thereof. In the above method, the trench and/or hole has an aspect ratio of at least about 20:1.

In the above method, the aspect ratio is in a range of about 30:1 to about 80:1. In the above method, a width of the trench and/or hole is at least about 200 nm, and wherein the etchant gas comprises at least one of $SF_6$, $CF_4$, or a combination thereof. In the above method, the repeating is performed about 1-10 times when a width of the trench and/or hole is at least about 200 nm. In the above method, the repeating is performed about 1-20 times when a width of the trench and/or hole is in a range of about 150 nm to about 200 nm. In the above method, the repeating is performed about 1-30 times when a width of the trench and/or hole is in a range of about 100 nm to about 150 nm.

In the above method, the repeating is performed about 1-40 times when a width of the trench and/or hole is about 100 nm or less. In the above method, at least one of the depositing or the etching is performed at a temperature in a range of about 50° C. to about 600° C. In the above method, at least one of the depositing or the etching is performed at a pressure in a range of about 1 Torr to about 5 Torr. In the above method, the depositing is performed via at least one of an atomic layer deposition (ALD) process, a plasma enhanced ALD (PEALD) process, or a plasma enhanced chemical vapor deposition (PECVD) process.

Another aspect is a method of filling a gap in a three dimensional structure over a semiconductor substrate, the method comprising: depositing a thin film at least on the three dimensional structure by a vapor deposition process comprising contacting the three dimensional structure with a reaction gas, the three dimensional structure comprising a trench and/or hole; and etching the deposited thin film using at least one etchant activated with an RF power having a frequency in a range of about 3 kHz to about 13,560 kHz.

The above method further comprises repeating a cycle of the depositing and the etching at least once until the trench and/or hole are filled with the thin film. In the above method, the depositing comprises activating the reaction gas with a frequency in a range of about 3 kHz to about 13,560 kHz. In the above method, the depositing comprises activating the reaction gas with a frequency in a range of about 100 kHz to about 3,000 MHz. In the above method, the RF power is in a range of about 100 watts to about 500 watts. In the above method, the etchant comprises at least one of $NF_3$, $ClF_3$, $F_2$, $SF_6$, $CF_4$, or a combination thereof. In the above method, the trench and/or hole has an aspect ratio of at least about 20:1. In the above method, the deposition process comprises at least one of an atomic layer deposition (ALD) process, a plasma enhanced ALD (PEALD) process, or a plasma enhanced chemical vapor deposition (PECVD) process.

Another aspect is a method of filling a gap in a three dimensional structure comprising a trench and/or hole over a semiconductor substrate, the method comprising: depositing a thin film at least on the three dimensional structure using a reaction gas activated with an RF power having a first frequency; and etching the deposited thin film such that a first portion of the thin film formed on an upper surface of the trench and/or hole is more etched than a second portion of the thin film formed on a remaining surface of the trench and/or hole.

The above method further comprises repeating a cycle of the depositing and the etching at least once until the trench and/hole are filled with the thin film. In the above method, the etching is performed such that a third portion of the thin film formed on a middle surface of the trench and/or hole is more etched than a fourth portion of the thin film formed on a lower surface of the trench and/or hole. In the above method, the etching is performed such that the first portion of the thin film is more etched than a fifth portion of the thin film formed on a top portion of the three-dimensional structure. In the above method, the top portion of the three dimensional structure comprises an edge portion bordering the upper surface of the trench and/or hole, and a remaining portion excluding the edge portion, and wherein a sixth portion of the thin film formed on the edge portion of the three dimensional structure is less etched than a seventh portion of the thin film formed on the remaining portion of the three dimensional structure.

In the above method, the etching is performed with an etchant activated with an RF power having a second frequency less than the first frequency. In the above method, the second frequency is in a range of about 3 kHz to about 13,560 kHz. In the above method, the depositing is performed such that a lower portion of the trench and/or hole is filled with the thin film prior to an upper portion of the trench and/or hole being filled with the thin film. In the above method, the depositing is performed such that a thickness of the thin film is substantially uniform throughout inner surfaces of the trench and/or hole.

Another aspect is a method of filling a gap in a three dimensional structure comprising a negatively sloped trench over a semiconductor substrate, the method comprising: converting the negatively sloped trench into a positively sloped trench; depositing a thin film in the positively sloped trench using a reaction gas; etching the deposited thin film using an etchant; and repeating a cycle of the depositing and the etching at least once until the positively sloped trench is filled with the thin film.

In the above method, the converting comprises supplying a deposition inhibitor to the negatively sloped trench while depositing the thin film in the negatively sloped trench. In the above method, the deposition inhibitor comprises an $N_2$ inhibitor. In the above method, the etchant is activated with an RF power having a frequency in a range of about 3 kHz to about 13,560 kHz. In the above method, the RF Power is in a range of about 100 watts to about 500 watts. In the above method, the depositing is performed with a reaction gas activated with an RF power having a frequency in a range of about 100 kHz to about 3,000 MHz. In the above method, the RF power is in a range of about 100 watts to about 20,000 watts. In the above method, the etching comprises widening an upper portion of the positively sloped trench.

Another aspect is a method of filling a gap in a three dimensional structure over a semiconductor substrate, the method comprising: depositing a thin film at least on the three dimensional structure using a reaction gas, the three dimensional structure comprising a trench and/or hole having an aspect ratio; etching the deposited thin film such that the trench and/or hole is etched at different etch rates in different portions of the trench and/or hole; and repeating a cycle of the depositing and the etching at least once until the trench and/or hole are filled with the thin film.

In the above method, the etching is performed such that the deposited thin film is etched with an etchant activated with an RF power having a frequency in a range of about 3 kHz to about 13,560 kHz, the RF power being in a range of about 100 watts to about 500 watts. In the above method, a first portion of the thin film formed on an upper surface of the trench and/or hole has a higher etch rate than a second portion of the thin film formed on a remaining surface of the trench and/or hole. In the above method, the depositing comprises activating the reaction gas with an RF power having a frequency in a range of about 100 kHz to about 3,000 MHz, the RF power being in a range of about 100 watts to about 20,000 watts. In the above method, the aspect ratio is at least about 20:1. In the above method, the three-dimensional structure comprises three-dimensional NAND flash elements. In the above method, the thin film filled in the trench and/or hole is substantially free of voids and/or seams.

Another aspect is a semiconductor thin film pattern manufactured by the above method, wherein the thin film filled in the trench and/or hole is substantially free of voids and/or seams. In the above semiconductor thin film pattern, a ratio of a volume of the voids/seams to a volume of the deposited thin film is in a range of about 0.001 to about 0.005 or less. In the above semiconductor thin film pattern, the thin film filled in the trench and/or hole contains no detectable voids and/or seams.

Another aspect is a semiconductor substrate comprising the above semiconductor thin film pattern.

Any of the features of an aspect is applicable to all aspects identified herein. Moreover, any of the features of an aspect is independently combinable, partly or wholly with other aspects described herein in any way, e.g., one, two, or three or more aspects may be combinable in whole or in part. Further, any of the features of an aspect may be made optional to other aspects.

BRIEF DESCRIPTION OF THE DRAWINGS

The foregoing and other features of the disclosure will become more fully apparent from the following description and appended claims, taken in conjunction with the accompanying drawings. Understanding that these drawings depict only several embodiments in accordance with the disclosure and are not to be considered limiting of its scope, the disclosure will be described with additional specificity and detail through use of the accompanying drawings.

FIG. 12 is a comparison diagram illustrating different etch rates at different portions of the pattern according to some embodiments and according to a comparative example using different RF frequencies.

DETAILED DESCRIPTION

Provided herein are various embodiments of gap-fill methods for filling features or structures such as high aspect ratio trenches, vias or holes. In some embodiments, the methods reduce or avoid the formation of voids or seams. For example, in certain embodiments, gap-fill methods disclosed herein use a combination of a high frequency RF power for a deposition process and a low frequency RF power for an etching process. The high frequency may be used to activate a reaction gas in the deposition process. The use of high frequency can improve the penetration of a plasma gas (i.e., reaction gas radicals) into a structure such as a trench/hole so as to obtain more uniform deposition throughout the structure. The high frequency may be, for example, in a range of about 13.56 MHz to about 100 MHz. The low frequency may be used to activate an etchant in the etching process. The use of low frequency can increase an ion bombardment effect so that more of higher energy etchant gas radicals can actively collide with the thin film, particularly, a thin film formed on a top portion of a structure, whereas less of high energy etchant gas radicals collide with the thin film formed on a lower portion of the structure. As a result, the thin film formed on the top portion of the structure can be etched more than the thin film formed on the lower portion of the structure. The low frequency can be, for example, in a range of about 3 KHz to about 13,560 KHz. By etching the top portion relative to the bottom, the deposition process can fill the feature from the bottom up. As a result, the combination of the high frequency based deposition and the low frequency based etching can be used to form a thin film in the structure substantially free of voids or seams. Although various embodiments are described based on atomic layer deposition (ALD) or plasma enhanced ALD (PEALD), the described technology is not limited thereto, and can be applied to other vapor deposition methods involving plasma gas such as plasma enhanced chemical vapor deposition (PECVD).

Deposition of a thin film within a high aspect ratio trench or hole is useful in the field of semiconductor fabrication, for example in gap fill processes. Using methods such as atomic layer deposition (ALD), a thin film can be deposited directly in three-dimensional (3D) structures, such as within a high aspect ratio hole. As indicated above, the methods can include a deposition portion or procedure and an etching portion or procedure. In some embodiments, using methods such as ALD, PEALD or PECVD, a thin film is deposited in a deposition procedure (or deposition portion or phase). That is followed by an etching procedure in which the deposited thin film is etched. The deposition and etching procedures can be repeated to fill a feature or structure, substantially without forming voids or seams.

Figure 1:
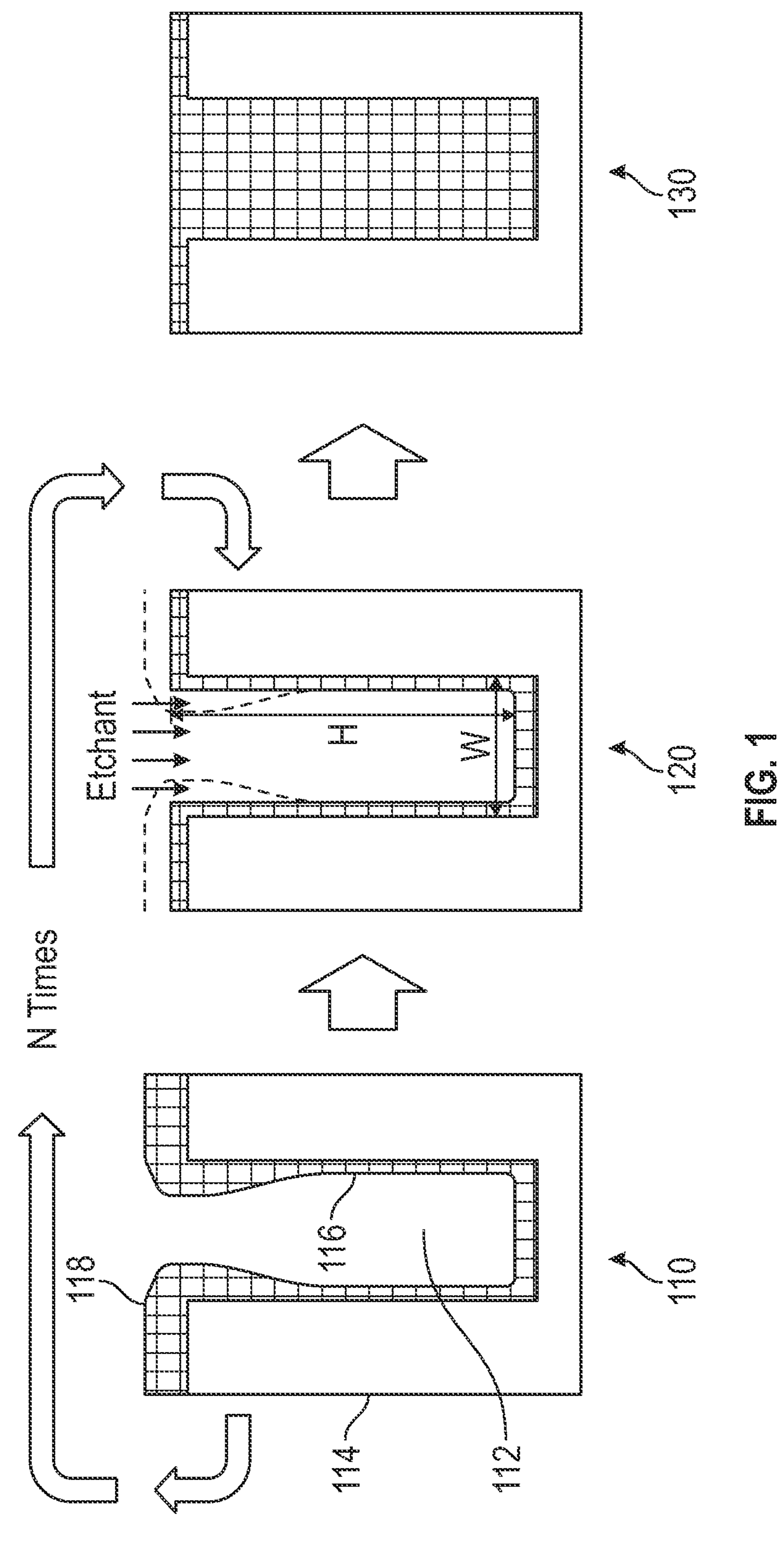
FIG. 1 illustrates a gap-fill process according to some embodiments.

FIG. 1 illustrates a gap fill process 100. The gap-fill process 100 includes a thin film deposition procedure 110 and an etching procedure 120. The deposition procedure 110 can be a vapor deposition process. In the thin film deposition procedure 110, a thin film 116 is deposited in a hole or trench 112 formed in a semiconductor pattern 114. In some embodiments, the trench 112 has an aspect ratio (AR) which is a ratio of the width (W) to the height (H) of the trench 112 (W/H). During the deposition procedure 110, an overhang or protruded portion 118 may be formed at least on an upper portion of the trench 112. In the etching procedure 120, the overhang or protruded portion 118 is etched with an etchant (see the dotted line in the etching procedure 120). The deposition procedure 110 and the etching procedure 120 are repeated N times until the trench 112 is filled with the thin film as shown in procedure 130, wherein N is a natural number.

Figure 2:
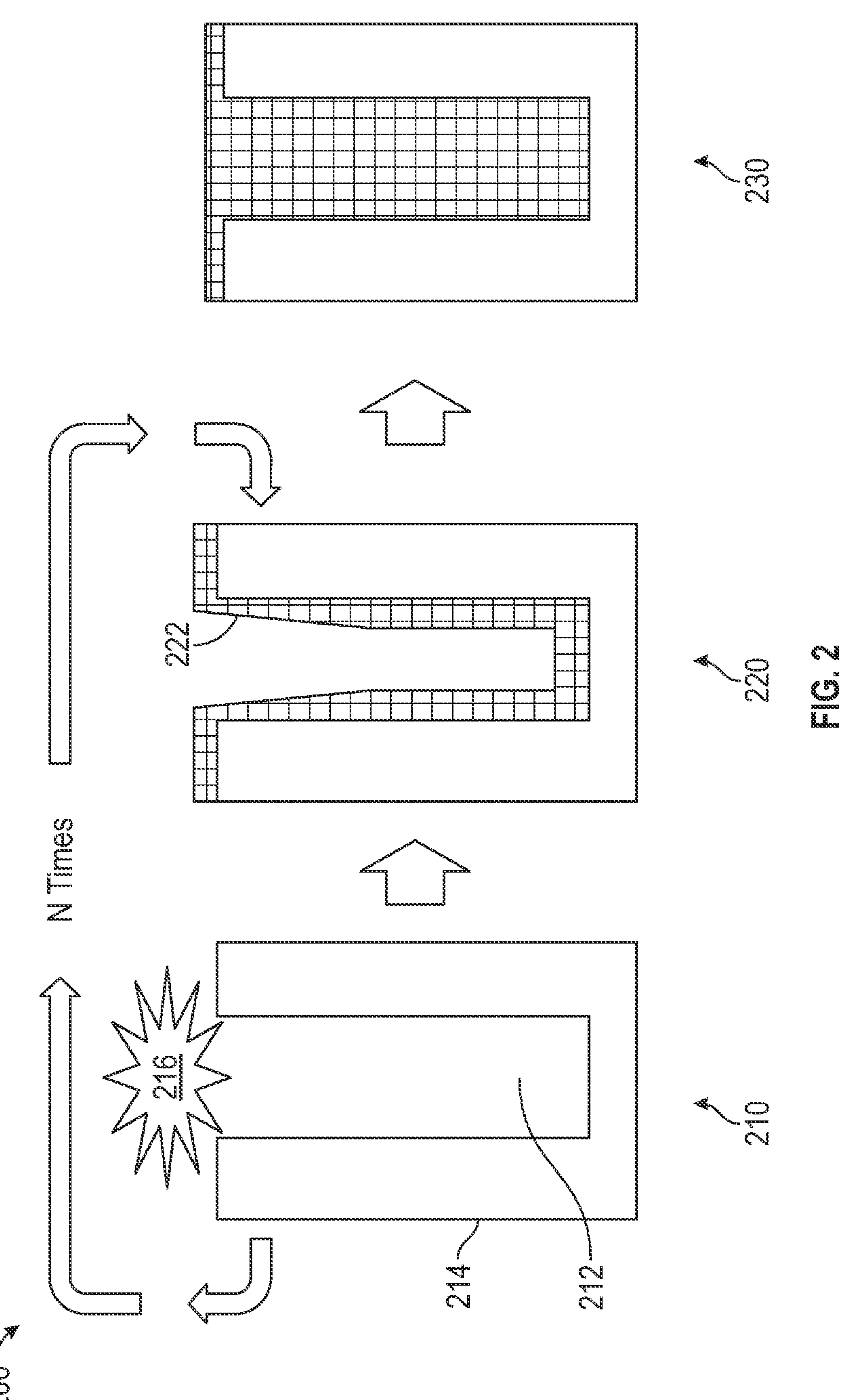
FIG. 2 illustrates another gap-fill process according to some embodiments.

FIG. 2 illustrates another gap-fill process 200. The gap-fill process 200 includes an inhibitor supplying procedure 210 and a deposition procedure 220. In the inhibitor supplying procedure 210, an inhibitor 216 activated with a plasma gas is supplied onto a semiconductor pattern 214 including a three-dimensional structure such as a trench 212. In some embodiments, an inhibitor or a deposition inhibitor can be used for inhibiting or preventing a source gas from adsorbing onto a semiconductor pattern, for example, in a vapor deposition process such as ALD to suppress or reduce thin film deposition. In the illustrated inhibitor supplying procedure 210, the inhibitor may be activated with a plasma gas (inhibitor plasma). The inhibitor 216 can inhibit adsorption of a source gas by converting a top portion of the semiconductor pattern 214 and an upper surface of the trench 212 into a passivation region such that a lesser amount of the thin film is formed on the top portion of the semiconductor pattern 214 and the upper surface of the trench 212. For example, when a nitrogen radical is used as an inhibitor, it may react with hydrogen elements on a surface of the semiconductor pattern 214 and vaporize to $NH_3$, resulting in reduced bonding of the source gas on the semiconductor pattern 214. In some embodiments, the inhibitor changes the substrate surface to reduce or inhibit subsequent deposition such that the changed substrate surface may have characteristics of a passivation layer. In the subsequent deposition procedure 220, the source gas and the reaction gas are alternatively supplied to the trench 212 to form a thin film 222. Due to the inhibitor 216, a lesser amount of the thin film 222 is deposited in the upper region of the trench 212 and a top portion of the pattern 214 than in the lower region of the trench 212. The inhibitor supplying procedure 210 and the deposition procedure 220 are repeated N times until the trench 212 is filled with the thin film as shown in procedure 230.

However, the above gap-fill processes 100 and 200 have limitations in that as an aspect ratio increases, for example, greater than about 20:1, one or more undesirable voids or seams may develop in the thin film. Particularly, for 3D NAND flash elements, as the height of vertically stacked gates increase, undesirable voids or seams may also increase. It would thus be advantageous to form a thin film within a high aspect ratio hole that is substantially free of voids or seams.

Some embodiments of the present disclosure use thin film deposition in a gap fill process to fill a feature or structure such as a high aspect ratio trench, via or hole in a way that reduces or avoids the formation of voids or seams. The feature or structure can be filled with any desired material, for example, $SiO_2$. Various embodiments will be described with reference to FIGS. 3-16.

Figure 3:
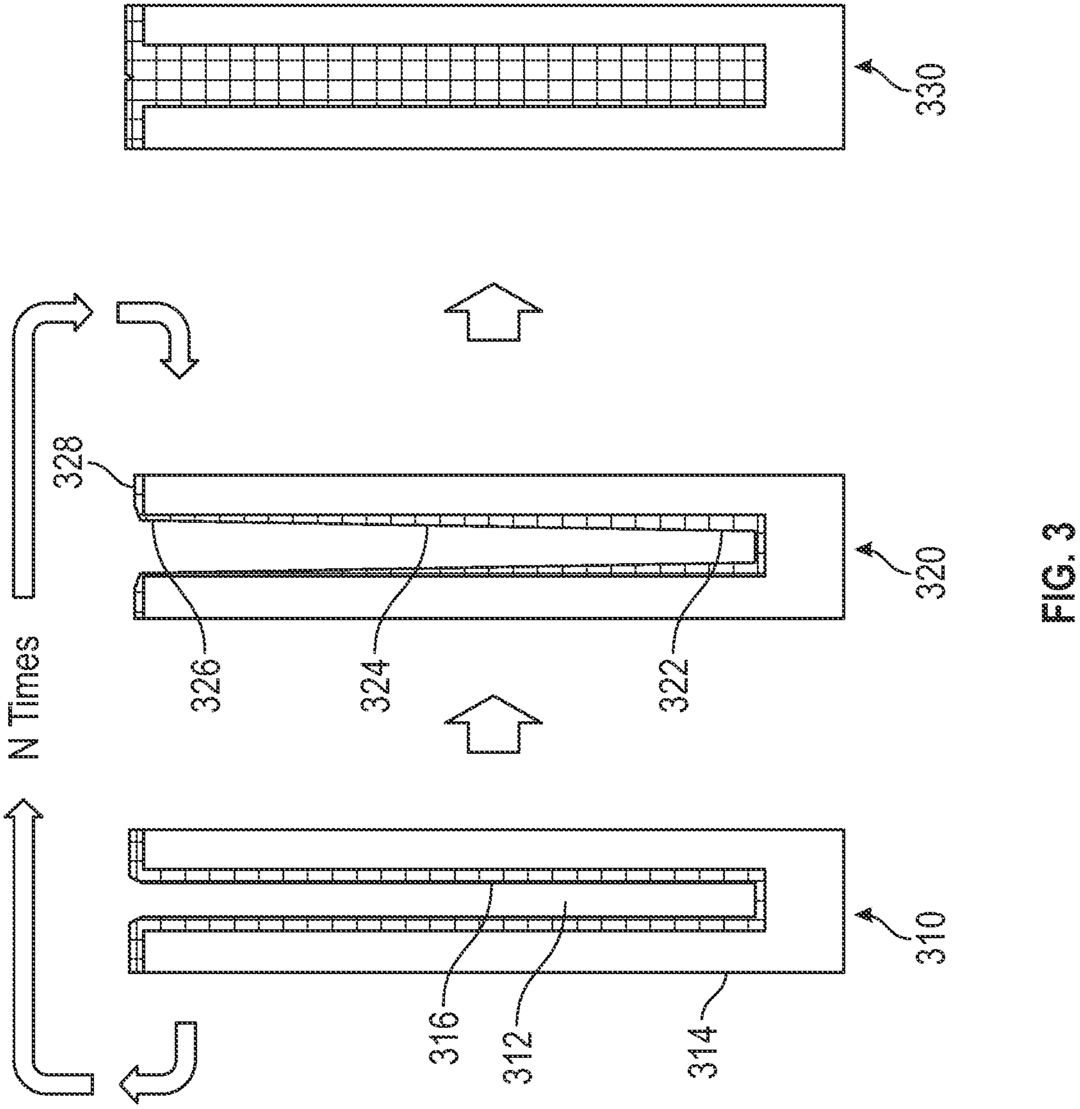
FIG. 3 illustrates an example gap-fill process according to some embodiments.

FIG. 3 illustrates an example gap-fill process 300 according to some embodiments. The gap-fill process 300 includes a thin film deposition procedure 310 and an etching procedure 320. In the thin film deposition procedure 310, a thin film 316 is deposited in a three-dimensional (3D) structure formed in a semiconductor pattern 314 of a substrate (not shown). For the purpose of convenience, only a portion of the semiconductor pattern 314 near the upper surface of the 3D structure is shown in FIG. 3. The 3D structure may include one or more of a trench, a hole, a gap or an opening. For the purpose of convenience, this disclosure will mainly use the term "trench," however, disclosed embodiments are not limited to filling a trench.

The deposition procedure 310 may be performed by a vapor deposition method including, but not limited to, atomic layer deposition (ALD), plasma enhanced ALD (PEALD) or plasma enhanced chemical vapor deposition (PECVD). The reactants used in these vapor deposition methods can be selected to deposit a desired material. In some embodiments a PEALD process is used in the deposition procedure 310. The PEALD process may comprise, for example, alternately and sequentially contacting the substrate with two or more reactants, at least one of which is activated. In some embodiments a PECVD process is used in the deposition procedure 310. For example, in some embodiments the substrate is contacted with one or more reaction gases, at least one of which is activated by plasma. etc.

The trench 312 may have a high aspect ratio. In some embodiments the high aspect ratio may be at least about 20:1. For example, the high aspect ratio may be in a range of about 20:1 to about 80:1. As another example, the high aspect ratio may be in a range of about 30:1 to about 80:1. These are merely examples, other aspect ratios may also be used (e.g., less than about 20:1 or greater than about 80:1).

The deposition procedure 310 may be performed to reduce, avoid or minimize the amount of overhang or protrusion on an upper surface of the trench 312 and the top portion of the pattern 314, as shown in FIG. 3. The deposition procedure 310 may be performed at least once (one deposition cycle), and in some embodiments is performed two or more times, e.g., a plurality of times (a plurality of deposition cycles). In some embodiments, the deposition procedure 310 may use a reaction gas activated with a radio frequency (RF) power. In some embodiments the RF power has a certain relatively high frequency (to be described in greater detail hereinafter).

In the etching procedure 320, the deposited thin film 316 may be etched such that an upper surface 326 of the trench 312 and a top portion 328 of the pattern 314 are more etched than the remaining portion of the trench 312. In some embodiments, the thin film formed on the upper surface 326 of the trench 312 and the top portion 328 of the pattern 314 are more etched than the thin film formed on a middle surface 324 of the trench 312 and a lower surface 322 of the trench 312. In some embodiments, the thin film formed on the upper surface 326 of the trench 312 and the top portion 328 of the pattern 314 may be etched similarly or substantially in the same amount. In other embodiments, the thin film formed on the upper surface 326 of the trench 312 may be etched less or more than the thin film formed on the top portion 328 of the pattern 314.

The lower surface 322 may include a bottom surface of the trench 312. The upper surface 326, the middle surface 324 and the lower surface 322 may be divided in many different ways. As a non-limiting example, the lower surface 322 may include a region extending from the bottom surface of the trench 312 to about a lower third of the trench 312, the upper surface 326 may include about an upper third of the trench 312, and the middle surface 324 may include a region between the upper surface 326 and the lower surface 322 of the trench 312.

In some embodiments, the thin film formed on the middle surface 324 of the trench 312 may be more etched than the thin film formed on the lower surface of the trench 312. As another example, the thin film formed on the middle surface 324 of the trench 312 and the lower surface 322 of the trench 312 may be similarly etched.

In some embodiments, the etching procedure 320 may be performed such that the deposited thin film 316 may be generally gradually more etched from the lower surface 322 of the trench 312 to the upper surface 326 of the trench 312 and the top portion 328 of the pattern 314. In other embodiments, the etching procedure 320 may be performed such that the deposited thin film 316 may be generally gradually more etched from the middle surface 324 of the trench 312 to the upper surface 326 of the trench 312 and the top surface of the pattern 314. In other embodiments, the etching procedure 320 may be performed such that the amount and/or the degree of the deposited thin film 316 being etched are different in different portions of the surfaces of the trench 312.

In some embodiments, the trench 312 may be divided into an upper-half surface and a lower-half surface (not shown). In these embodiments, the thin film formed on the upper-half surface of the trench 312 may be more etched than the thin film formed on the lower-half surface of the trench 312.

In some embodiments, the amount and/or the degree of the etching may be controlled based at least in part on the strength of an RF power and/or a frequency being applied to an etchant. In some embodiments, the etching procedure 320 may use an etchant activated with a certain RF power having a certain relatively low frequency to etch the thin film formed on the upper surface 326 of the trench 312 and the top portion 328 of the pattern 314 more than the thin film formed on the remaining portion of the trench 312 (as described in greater detail below). In some embodiments, the example gap-fill process 300 may include a separate etchant activation procedure prior to the etching procedure 320. The separate etchant activation procedure may use the above RF power. The etching procedure 320 may be performed at least once (one etching cycle), e.g., a plurality of times (a plurality of etching cycles). In some embodiments, the etchant and/or RF power applied to the etchant may not need to be provided/applied in every cycle. The deposition procedure 310 can be repeated multiple times relative to each etch process 320. For example, the etch process can be carried out at intervals in the overall process, or at a certain ratio with the deposition cycles.

The deposition procedure 310 and the etching procedure 320 may be repeated N times until the trench 312 is filled with the thin film 316, and the top portion 328 of the pattern 314 is covered with a thin film 316 having a substantially uniform thickness as shown in procedure 330. According to some embodiments, the thin film 316 substantially free of voids and/or seams can be deposited in the trench 312 and the top portion of the pattern 314.

Figure 4:
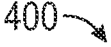
FIG. 4 illustrates an example method of filling a gap in a feature or structure in a patterned semiconductor substrate in a semiconductor manufacturing process according to some embodiments.
Figure 4:
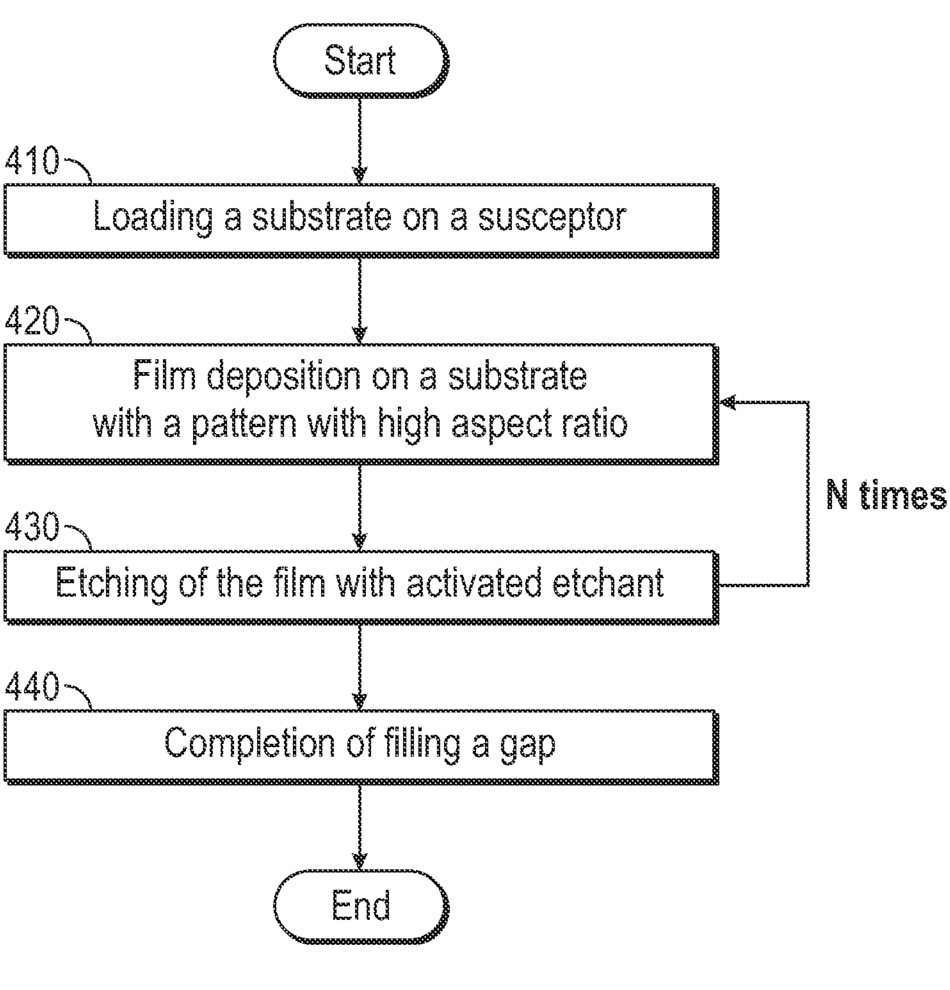

FIG. 4 illustrates an example method 400 of filling a gap in a semiconductor pattern in a semiconductor manufacturing process according to some embodiments. Although the method 400 is described herein with reference to a particular order, in various embodiments, steps herein may be performed in a different order, or omitted, and additional steps may be added. For example, a step of activating a reaction gas may precede a deposition procedure, and/or a step of activating an etchant may precede an etching procedure. This may apply to the methods 500, 1400 and 1600 shown in FIGS. 5, 14 and 16.

In step 410, a semiconductor substrate may be loaded on a reaction space of a reactor (not shown). For example, the substrate may be loaded on a susceptor or a heating block inside the reactor. The substrate may include a semiconductor pattern including a 3D structure such as a trench/hole. In some embodiments the substrate may comprise a trench that may have an aspect ratio of at least about 20:1, e.g., about 20:1 to about 80:1, such as about 30:1 to about 80:1 (hereinafter to be interchangeably used with a high aspect ratio). These ranges of the aspect ratio are merely examples, and may include any range of values between about 20:1 and about 80:1. Furthermore, the aspect ratio may also include a ratio less than about 20:1 or greater than about 80:1.

In step 420, a thin film may be deposited on the pattern of the substrate including a high aspect ratio trench (deposition procedure). In some embodiments, the thin film may include $SiO_2$. Other types of thin films may also be formed. When an $SiO_2$ thin film is used, the source gas (Si precursor) may include an aminosilane, iodosilane, or halide type Si precursor. For example, the Si precursor may include one or more of: DIPAS, $SiH_3N(iPr)_2$; TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; TEOS, $Si(OEt)_4$; $SiCl_4$; HCD, $Si_2Cl_6$; 3DMAS, $SiH(N(Me)_2)_3$; BEMAS, Si $H_2[N(Et)(Me)]_2$; AHEAD, $Si_2$ $(NHEt)_6$; TEAS, $Si(NHEt)_4$; $Si_3H_8$; DCS, $SiH_2Cl_2$; $SiHI_3$; or $SiH_2I_2$.

The deposition procedure 420 may use a reaction gas for forming the thin film. The reaction gas may comprise oxygen. For example, the reaction gas may include $O_2$, $O_3$, $H_2O$, $NO_2$, $N_2O$, or a combination thereof.

In the deposition procedure 420, the reaction gas may be activated with a first RF power having a first frequency. The first frequency may be in a range of about 100 kHz to about 3,000 MHz, for example, about 100 kHz, about 500 kHz, about 1,000 kHz, about MHz, about 50 MHz, about 500 MHz, about 1,000 MHz, about 2,000 MHz or about 3,000 MHz, or any range of values therebetween. In some embodiments, the first frequency may be in a range of about 27.12 MHz to about 100 MHz. In other embodiments, the first frequency may be about 27.12 MHz. These ranges of the first frequency are merely examples, and may also include a frequency less than about 100 kHz or greater than about 3,000 MHz.

The first RF power may be in a range of about 100 watts to about 20,000 watts, for example, about 100 watts, about 500 watts, about 1,000 watts, about 5,000 watts, about 10,000 watts or about 20,000 watts, or any range of values therebetween. In some embodiments, more effective deposition (e.g., more uniform deposition of thin film) may be obtained with the first RF power in a range of about 500 watts to about 3,000 watts. These ranges of the first RF power are merely examples, and may also include an RF power less than about 100 watts or greater than about 20,000 watts.

The deposition procedure 420 may have at least one deposition cycle prior to performing the etching procedure 430. The number of deposition cycles may increase as the aspect ratio becomes larger, i.e. the depth of the trench becomes greater and the width of the trench becomes smaller. For example, about 1-10 deposition cycles within the deposition procedure 420 may be used when the aspect ratio is at least about 20:1 and the width of the trench is at least about 200 nm. As another example, in the same aspect ratio, about 1-20 deposition cycles within the deposition procedure 420 may be used for the width of the trench being in a range of about 150 nm to about 200 nm, about 1-30 deposition cycles within the deposition procedure 420 may be used for the width of the trench being in a range of about 100 nm to about 150 nm, and about 1-40 deposition cycles within the deposition procedure 420 may be used for the width of the trench being less than about 100 nm. These numbers of deposition cycles are merely examples, and other numbers of deposition cycles can also be used.

In step 430, the deposited thin film may be etched with an activated etchant (etching procedure). In some embodiments the etchant may comprise fluorine. For example, the etchant may include $NF_3$, $ClF_3$, $F_2$, $SF_6$, $CF_4$, or a combination thereof. These are merely examples, and other etchants for thin film etching may also be used. The etchant may be activated to a plasma gas with a second RF power having a second frequency. In some embodiments, the etchant may be activated on the pattern in-situ in the reaction space while the second RF power having the second frequency is applied. In other embodiments, the etchant may be activated with the second RF power outside the reaction space and the activated etchant may be provided to the reaction space. The second RF power may be less than the first RF power (to be described in greater detail). The second frequency may be less than the first frequency (to be described in greater detail).

In some embodiments, the second frequency may be in a range of about 3 kHz to about 13,560 kHz, for example, about 3 kHz, about 30 kHz, about 100 kHz, about 500 kHz, about 1,000 kHz, about 5,000 kHz, about 10,000 kHz or about 13,560 kHz, or any range of values therebetween. In some embodiments, more effective etching may be obtained with the second frequency in a range of about 100 kHz to about 5,000 kHz. In other embodiments, even more effective etching may be obtained with the second frequency being about 430 kHz. However, these ranges of the first frequency are merely examples, and may also include a frequency less than about 3 kHz or greater than about 13,560 kHz.

The second RF power may be in a range of about 100 watts to about 500 watts, for example, about 100 watts, about 200 watts, about 300 watts, about 400 watts or about 500 watts, or any range of values therebetween. In some embodiments, more effective etching may be obtained with the second RF power being about 300 watts. However, these ranges of the second RF power are merely examples, and may also include an RF power less than about 100 watts or greater than about 500 watts.

The deposition procedure 420 and the etching procedure 430 may be performed N times (N is a natural number) until the trench is filled with the thin film (step 440). As described above, the number of repeating may vary depending on one or more of a type of the reaction gas, a type of the etchant, the strength of the first and second RF powers, the strength of the first and second frequencies, the size of the aspect ratio, the width of the trench or other processing parameters including, but not limited to, temperature, pressure, source/reaction gas flow rate, or process time per unit cycle, etc.

The deposited thin film may be substantially free of voids and/or seams. In some embodiments, the deposited thin film may be considered as substantially free of voids and/or seams, when the ratio of the volume of the voids/seams to the volume of the entire thin film is in a range of about 0.001 to about 0.005, or less than the range. In determining whether the thin film is substantially free of voids and/or seams, a transmission electron microscope (TEM) analysis device may be used. Other equipment for determining voids/seams may be also used.

Figure 5:
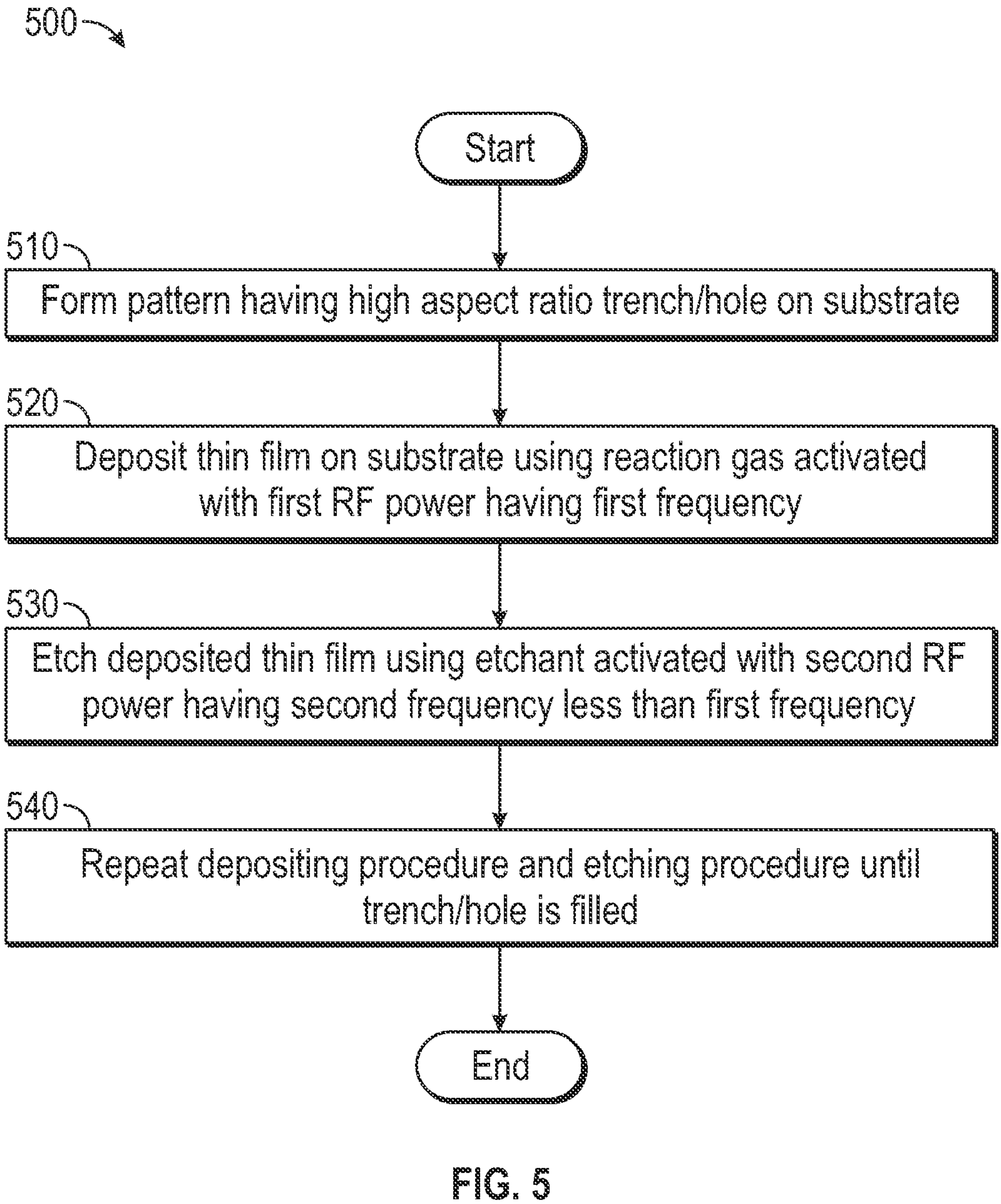
FIG. 5 illustrates another example method of filling a gap in a feature or structure in a patterned semiconductor substrate in a semiconductor manufacturing process according to some embodiments.

FIG. 5 illustrates another example method 500 of filling a gap in a semiconductor pattern in a semiconductor manufacturing process according to some embodiments. In step 510, a semiconductor pattern having a high aspect ratio trench/hole may be formed on a substrate. As described above, in some embodiments the high aspect ratio may be at least about 20:1.

In step 520, a thin film may be deposited on the substrate including the semiconductor pattern using a reaction gas activated with a first RF power having a first frequency (deposition procedure). The reaction gas may include, but is not limited to, $O_2$, $O_3$, $H_2O$, $NO_2$, $N_2O$, or a combination thereof. The first frequency may be in a range of about 100 kHz to about 3,000 MHz. The first RF power may be in a range of about 100 watts to about 20,000 watts.

In step 530, the deposited thin film may be etched using an etchant activated with a second RF power having a second RF frequency lower than the first frequency (etching procedure). The etchant may include, but is not limited to, $NF_3$, $ClF_3$, $F_2$, $SF_6$, $CF_4$, or a combination thereof. The second frequency may be in a range of about 3 kHz to about 13,560 kHz. The second RF power may be in a range of about 100 watts to about 500 watts.

In step 540, a cycle of the deposition procedure (step 520) and the etching procedure (step 530) may be repeated, for example, N times (N is a natural number) until the trench and/or hole is filled with the thin film. The number of repeating may vary depending on one or more of the above described processing parameters and conditions. The TEM analysis device can be used to whether the trench/hole is filled with the thin film substantially free of voids and/or seams.

Figure 6:
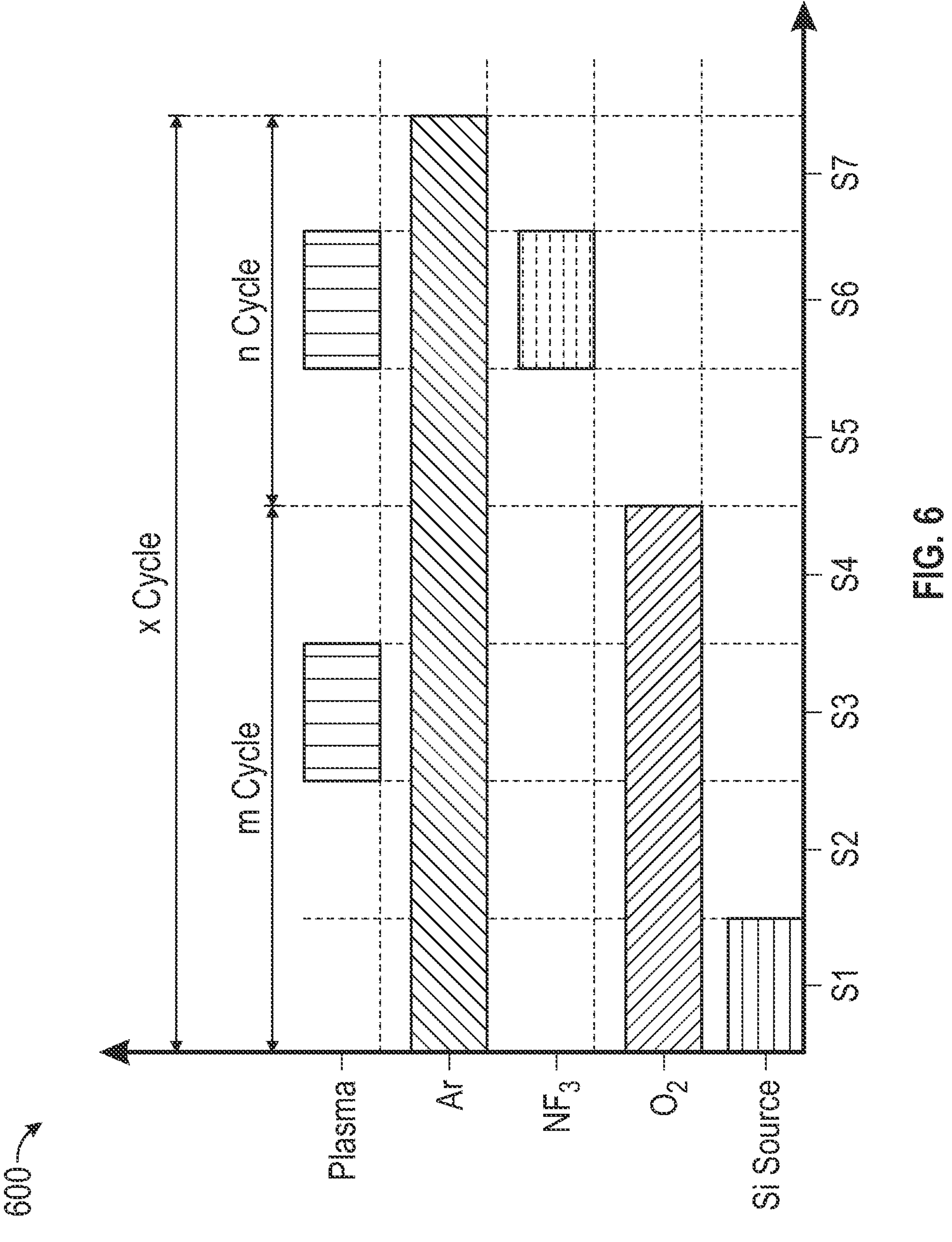
FIG. 6 illustrates a process sequence of a gap-fill process according to some embodiments.

FIG. 6 illustrates a process sequence 600 of the gap-fill method according to some embodiments. The process sequence illustrated in FIG. 6 can be used to fill a gap in a structure in a patterned semiconductor substrate. In some embodiments, the structure may have an aspect ratio of about 20:1 or greater. In some embodiments, PEALD may be used to form a thin film of $SiO_2$ in the process sequence 600. However, other combinations of aspect ratios, deposition methods and the type of a thin film, etc., can also be used. The process sequence 600 may include a deposition procedure (S1-S4) and an etching procedure (S5-S7). FIG. 6 is merely an example sequence for deposition and etching, and one or more of the steps may be omitted, an additional step may be added, or at least two steps may be combined into a single step. The entire sequence 600 may be repeated for an x number of cycles (x is a natural number).

Deposition Procedure

The deposition procedure (S1-S4) may be performed for m number of cycles (where m is a natural number) in each cycle. For example, the deposition procedure (S1-S4) may be performed at least once. For the purpose of convenience, the deposition procedure (S1-S4) is illustrated for the deposition of $SiO_2$, using an Si precursor as a source gas, $O_2$ as a reaction gas and Ar as a carrier gas which may purge a remaining gas from the reaction space. However, other combinations of the source gas, the reaction gas or the carrier gas may also be used. The source gas may be provided only in step S1. The reaction gas may be continuously provided throughout steps S1-S4. The carrier gas may be continuously provided throughout the deposition procedure (S1-S4) and the etching procedure (S5-S7).

The deposition procedure (S1-S4) may be performed at a temperature in a range of about 20° C. to about 600° C., for example, about 20° C. to about 30° C., about 20° C. to about 100° C., about 50° C. to about 600° C., or about 400° C. to about 550° C. The deposition procedure (S1-S4) may be performed at a pressure in a range of about 1 Torr to about 5 Torr, for example, about 3 Torr. During the deposition procedure (S1-S4), the reaction gas ($O_2$) may be provided to the reaction chamber at a gas flow rate in a range of about 2,000 sccm to about 4,000 sccm, e.g., about 3,000 sccm.

The deposition procedure may include a source gas feeding step (S1), a source gas purge step (S2), an $SiO_2$ layer forming step (S3), and a reaction gas purge step (S4). In the source gas feeding step (S1), the source gas may be provided. For example, an Si precursor vapor and a carrier gas (Ar) may be provided on the substrate so that the Si precursor is adsorbed on the substrate surface, for example, on the surface of the structure or feature such as the trench or hole. During the source gas feeding step (Si), the carrier gas (Ar) may be provided to the reaction chamber at a gas flow rate in a range of about 500 sccm to about 1,500 sccm, e.g., about 1,000 sccm. The processing time of the source gas feeding step (S1) per unit cycle may be in a range of about 0.1 second to about 0.4 second, e.g., about 0.2 second.

In the source gas purge step (S2), Si vapor adsorbed (e.g., physisorbed) into the substrate and/or excess source gas may be purged using the carrier gas (Ar). During the source gas purge step (S2) and the reaction gas purge step (S4), the carrier gas (Ar) may be provided to the reaction chamber at a gas flow rate in a range of 500 sccm to about 1,000 sccm, e.g., about 700 sccm. The processing time of the source gas purge step (S2) per unit cycle may be in a range of about 0.1 second to about 0.5 second, e.g., about 0.3 second.

In the $SiO_2$ layer forming step (S3), the reaction gas ($O_2$) may be supplied to the substrate while the first RF power having the first frequency is applied to the reaction gas to activate the reaction gas. The first RF power may be in a range of about 300 watts to about 2,000 watts, e.g., about 950 watts. The first frequency may be in a range of about 13.56 MHz to about 100 MHz, e.g., about 27.12 MHz. The activated $O_2$ may chemically react with Si vapor to form a monolayer of $SiO_2$. The processing time of the $SiO_2$ layer forming step (S3) per unit cycle may be in a range of about 0.1 second to about 0.5 second, e.g., about 0.3 second.

When the first RF power having the first frequency is applied to the reaction gas ($O_2$), the amount and/or density of oxygen radicals (O radicals) may increase (e.g., compared to a lower frequency being applied to the reaction gas) so that a greater amount of oxygen radicals can react with Si vapor, resulting in a substantially uniform $SiO_2$ layer formed in the trench. For example, the first frequency described above can achieve a desired uniformity of deposition in the feature or structure. Although oxygen is described as a reaction gas, the described technology is not limited to oxygen and it can be applied to other reaction gases and their radicals. This operation is described in more detail below.

Figures 7A, 7B:
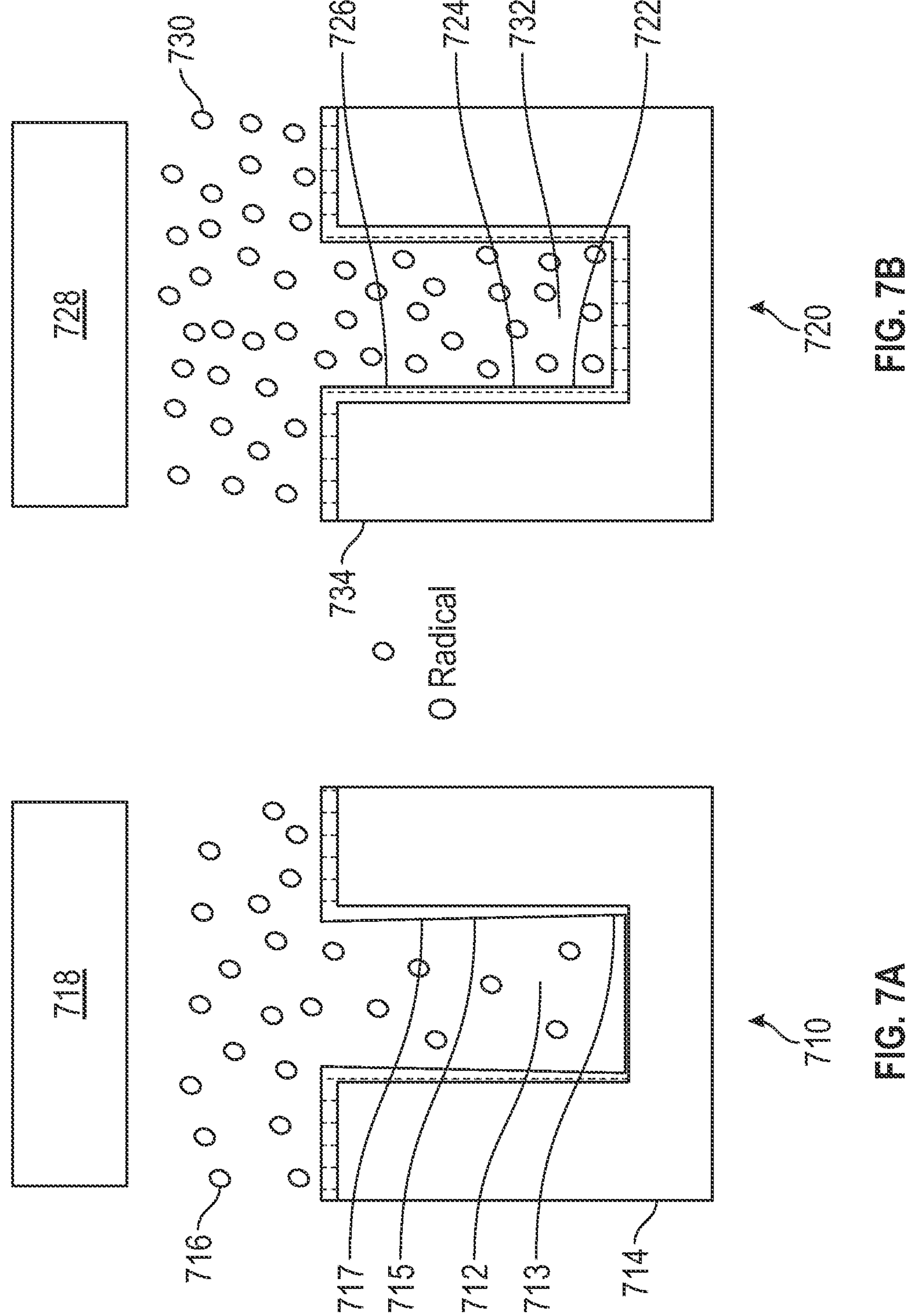
FIGS. 7A and 7B are example diagrams illustrating a relationship between a frequency and an amount of oxygen radicals being generated during the deposition step according to some embodiments

FIGS. 7A and 7B are example diagrams illustrating a relationship between a frequency and an amount of oxygen radicals being generated during the deposition procedure of the gap-fill method according to some embodiments.

FIG. 7A shows a deposition procedure 710 according to a comparative example where an RF power having a low frequency such as about 430 kHz is applied to the reaction gas ($O_2$). During the deposition procedure 710, a source gas (Si precursor) is deposited onto the pattern 714 and the trench 712, while applying the low frequency RF power to the reaction gas ($O_2$) using an electrode 718 to activate the reaction gas ($O_2$). As a result, oxygen radicals 716 are generated and these radicals 716 react with Si vapor to form an $SiO_2$ layer (thin film) on the pattern 714. However, due to the low frequency RF power, substantially less oxygen radicals 716 are generated, resulting in a lesser amount of the $SiO_2$ layer formed in a lower surface 713 and a middle surface 715 of the trench 712 compared to an upper surface 717 of the trench 712 (FIG. 7A). That is, the $SiO_2$ layer becomes thicker as it moves from the lower surface 713 to the upper surface 717 of the trench 712.

FIG. 7B shows a deposition procedure 720 according to some embodiments where an RF power having a high frequency such as about 27.12 MHz is applied to the reaction gas ($O_2$). FIG. 7B shows that the use of high frequency can improve the penetration of the plasma (i.e., reaction gas radicals) into a structure such as a trench/hole so as to obtain more uniform deposition throughout the structure. During the deposition procedure 720, a source gas (Si precursor) is deposited onto the pattern 714 and the trench 712, while applying the high frequency RF power to the reaction gas ($O_2$) using an electrode 728 to activate the reaction gas ($O_2$). As a result, oxygen radicals 730 are generated and these radicals 730 react with Si vapor to form an $SiO_2$ layer (thin film) on the pattern 734. Due to the high frequency RF power, substantially more oxygen radicals 730 are generated and these more oxygen radicals 730 react with Si vapor, resulting in a substantially uniform $SiO_2$ layer formed in a lower surface 722, a middle surface 724 and an upper surface 726 of the trench 732. That is, the thickness of the $SiO_2$ layer may be substantially similar or the same throughout the surface of the trench 732. In some embodiments, the thickness of the $SiO_2$ layer at least in the lower and middle surfaces of the trench 732 may be at least about 5%-about 10% greater in the deposition procedure 720 than in the deposition procedure 710. Here, 27.12 MHz is merely an example of a high frequency, and other high frequencies, for example, in a range of about 13.56 MHz to about 100 MHz described above, may also achieve similar results.

Figure 8:
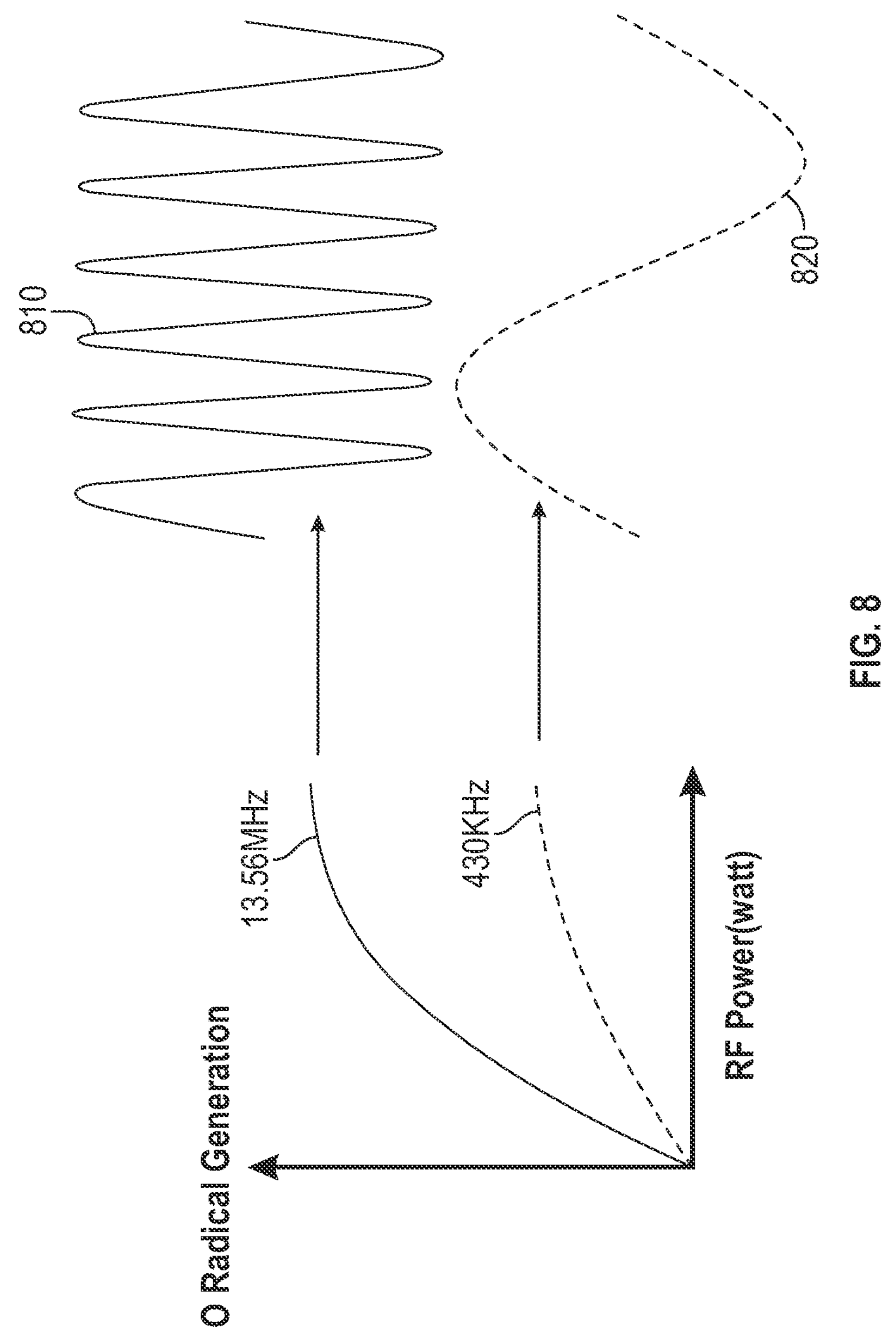
FIG. 8 is another example diagram illustrating a relationship between a frequency and an amount of oxygen radicals being generated during the deposition step according to some embodiments

FIG. 8 is another example diagram illustrating a relationship between a frequency and an amount of oxygen radicals being generated during the deposition procedure according to some embodiments. Although oxygen radicals are illustrated in FIG. 8, it can be applied to other reaction gas radicals. Referring to FIG. 8, when a low frequency 820 such as about 430 kHz is used during a thin film deposition procedure, a substantially lesser amount of oxygen radicals may be generated, resulting in an uneven $SiO_2$ layer formed on a feature or structure such as the trench described above with respect to FIG. 7A. In contrast, when a high frequency 810 such as 13.56 MHz is used, a significantly larger amount of oxygen radicals may be generated, resulting in a substantially even $SiO_2$ layer formed in the surface of the trench described above with respect to FIG. 7B. Again, 13.56 MHz is merely an example of a high frequency, and other high frequencies, for example, in a range of about 13.56 MHz to about 100 MHz described above, may also achieve similar results.

Referring back to FIG. 6, in the reaction gas purge step (S4), a remaining reaction gas which has not reacted with the source gas may be purged. In some embodiments, during the reaction gas purge step (S4), the carrier gas (Ar) may be provided to the reaction chamber at a gas flow rate in a range of about 500 sccm to about 1,000 sccm, e.g., about 700 sccm. The processing time of the reaction gas purge step (S4) per unit cycle may be in a range of about 0.1 second to about 0.5 second, e.g., about 0.2 second. The cycle of S1-S4 may be repeated at least once (e.g., m cycles, m is a natural number).

Table 1 is a summary of example processing parameters or conditions that can be used to perform the deposition procedure (S1-S4). Again, the above described parameters and conditions, and those shown in Table 1 are merely examples, and other numbers or values can also be used.

TABLE 1

A Process Condition for Deposition Procedure of FIG. 6 (S1 to S4)

| | | |
|---|---|---|
| Temperature | | 50 to 600° C. (e.g., 400-550° C.) |
| Pressure (Torr) | | 1 to 5 Torr, e.g., 3 Torr |
| Gas flow rate (sccm) | Source carrier Ar | 500 to 1,500 sccm, e.g., 1,000 sccm |
| | $O_2$ | 2,000 to 4,000 sccm, e.g., 3,000 sccm |
| | Purge Ar | 500 to 1,000 sccm, e.g., 700 sccm |
| Process time per unit cycle (sec) | Source feeding (S1) | 0.1 to 0.4 second, e.g., 0.2 second |
| | Source purge (S2) | 0.1 to 0.5 second, e.g., 0.3 second |
| | Plasma on (S3) | 0.1 to 0.5 second, e.g., 0.3 second |
| | Purge (S4) | 0.1 to 0.5 second, e.g., 0.2 second |
| Plasma condition | RF frequency | 13.56 MHz to 100 MHz, e.g., 27.12 MHz-100 MHz |
| | RF power | 100 to 20,000 watts, e.g., 500 watts-3000 watts |

Etching Procedure

The etching procedure (S5-S7) may be performed for n number of cycles (where n is a natural number). For example, the etching procedure (S5-S7) may be performed at least once. For the purpose of convenience, the etching procedure (S5-S7) may use $NF_3$ as an etchant and Ar as a carrier gas. However, other combinations of the etchant and the carrier gas may also be used. For example, other etchants such as $ClF_3$, $SF_6$, $CF_4$ or $F_2$, or other etchant containing fluorine or non-fluorine may also be used. The etchant may be provided only in step S6. The carrier gas may be continuously provided throughout the etching procedure (S5-S7).

The etching procedure (S5-S7) may be performed at a temperature in a range of about 50° C. to about 600° C., for example, about 400° C. to about 550° C. The etching procedure (S5-S7) may be performed at a pressure in a range of about 1 Torr to about 5 Torr, for example, about 2 Torr.

The etching procedure (S5-S7) may include a remaining gas purge step (S5), an etching step (S6) and a remaining etchant/etched thin film purge step (S7). In the remaining gas purge step (S5), a remaining gas which has not reacted during the deposition procedure (S1-S4) may be purged. During the remaining gas purge step (S5), the carrier gas (Ar) may be provided to the reaction chamber at a gas flow rate in a range of about 5,000 sccm to about 10,000 sccm, e.g., about 7,000 sccm. The processing time of the remaining gas purge step (S5) per unit cycle may be in a range of about 0.1 second to about 10.0 seconds, e.g., about 6.0 seconds.

In the etching step (S6), the deposited thin film of the $SiO_2$ layer may be etched with an etchant activated with a second RF power having a second frequency. The etchant may comprise fluorine. For example, the etchant may include at least one of $NF_3$, $ClF_3$, $F_2$, $SF_6$, $CF_4$, or a combination thereof. In some embodiments, at least one of $SF_6$ or $CF_4$ may be used for etching a thin film formed in a trench having an aspect ratio of at least about 20:1 with a trench width of about 200 nm for an improved etching effect. $NF_3$ may be used for the etching step (S6). The second RF Power may be in a range of about 100 watts to about 500 watts, for example, about 300 watts. The second frequency may be in a range of about 3 kHz to about 13,560 kHz, for example, about 100 kHz to about 5,000 kHz.

During the etching step (S6), the etchant may be provided to the reaction chamber at a gas flow rate in a range of about 200 sccm to about 1,000 sccm, e.g., about 300 sccm. The processing time of the etching step (S6) per unit cycle may be in a range of about 5.0 second to about 15.0 second, e.g., about 11.0 second.

The etching step (S6) will be described in greater detail with respect to FIGS. 9A-12. When the second RF power having the second frequency is applied to the etchant ($NF_3$), an ion bombardment effect of fluorine radicals (F radicals) may increase so that more etching can be achieved on an upper surface of the trench than on a lower surface of the trench. This operation is described in more detail by referring to FIGS. 9A-10C.

Figures 9A, 9B:
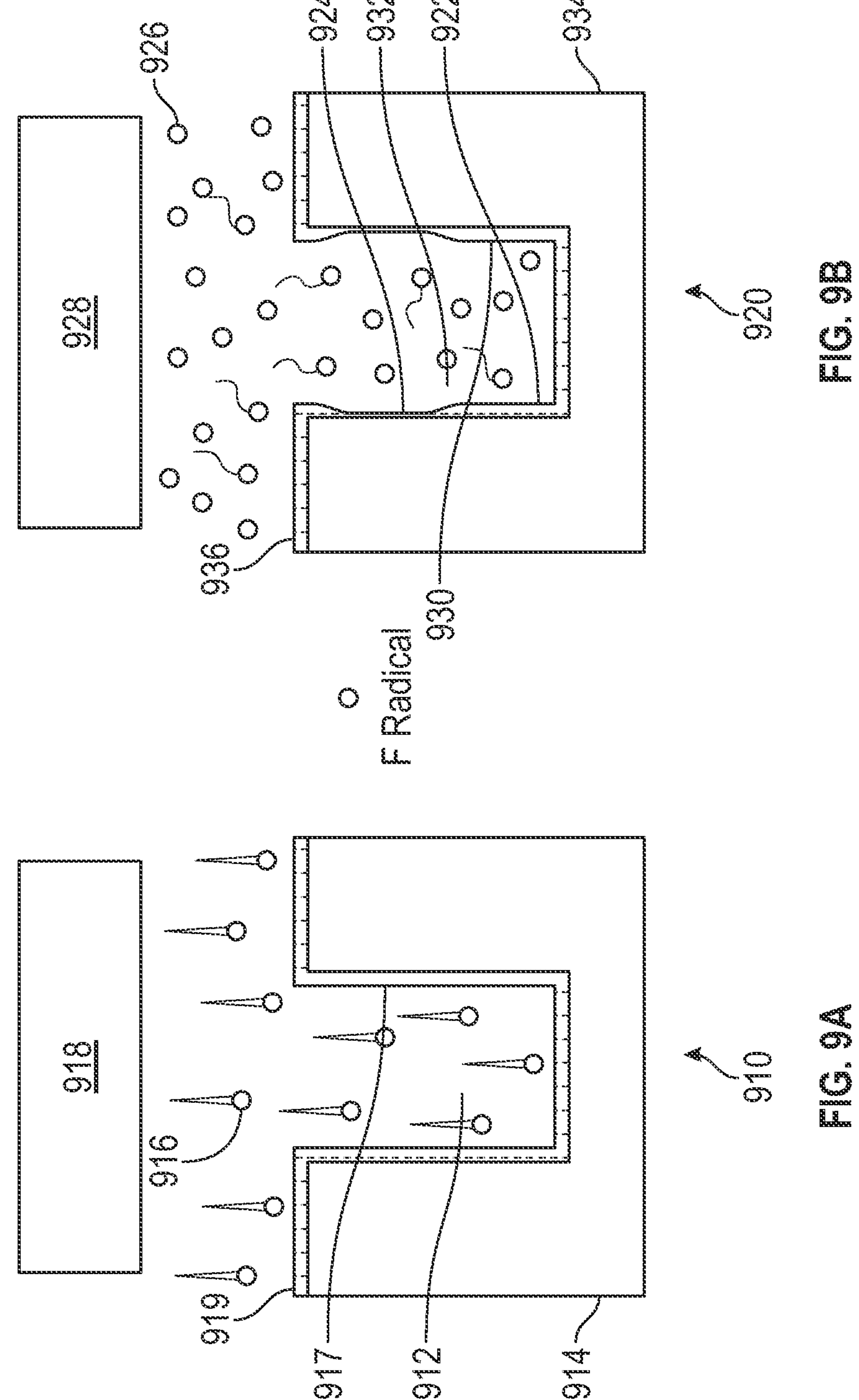
FIGS. 9A and 9B are example diagrams illustrating a relationship between a frequency and an amount of an ion bombardment effect during the etching procedure according to some embodiments.

FIGS. 9A and 9B are example diagrams illustrating a relationship between a frequency and an amount of an ion bombardment effect during the etching procedure according to some embodiments.

FIG. 9B shows an etching procedure 920 according to a comparative example where an RF power having a high frequency such as about 27.12 MHz is applied to the etchant. During the etching procedure 920, an etchant ($NF_3$) is applied to the deposited film 930, while applying an RF power having the high frequency (27.12 MHz) to the etchant ($NF_3$) through an electrode 928 to activate the etchant. More fluorine radicals (F radicals) 926 are generated due to the high frequency such that the trench 932 is saturated with the generated F radicals 926. However, the generated F radicals 926 have a relatively lower energy due to a shorter wavelength of the high frequency. In this situation, a thin film formed on an upper surface 924 (e.g., upper half) of the trench 932 is more etched than that on a remaining portion of the trench 932 and a top portion 936 of the pattern 934, as the thin film on the upper surface of the trench 932 is more weakly formed than the thin film on other portions of the trench (i.e., can be more easily removed by etching than other portions). As a result, the thin film formed on the top portion 936 of the pattern 934 is less etched than the thin film formed the upper surface 924 of the trench 932. That is, the Sift layer becomes thicker from the upper surface 924 of the trench 932 to the top portion 936 of the pattern 934.

FIG. 9A shows an etching procedure 910 according to some embodiments where an RF power having a low frequency such as about 430 KHz is applied to the etchant. During the etching procedure 910, the etchant ($NF_3$) is applied to the deposited film 917, while applying an RF power having the low frequency (such as about 430 KHz) to the etchant ($NF_3$) through an electrode 918 to activate the etchant. Although less fluorine radicals (F radicals) 916 are generated due to the low frequency, the generated F radicals 916 may have a relatively stronger energy due to a longer wavelength of the low frequency. In this situation, more of the higher energy F radicals can actively collide with the thin film, particularly, a thin film formed on the top portion 919 of the pattern 914 (increased ion bombardment effect), whereas less of the higher energy F radicals collide with the thin film 917 on the remaining portion of the trench 912. As a result, the thin film formed on the top portion 919 of the pattern 914 is more etched than the thin film 917 formed on the trench 912. For example, gradually more etching of the thin film can be achieved as it moves from the top portion 919 of the pattern 914 to the upper surface and lower surface of the trench 912. That is, the $SiO_2$ layer may become thinner as it moves from the lower surface of the trench 912 to the top surface of the pattern 914. Here, 430 KHz is merely an example of a low frequency, and other low frequencies, for example, in a range of about 3 kHz to about 13,560 kHz described above, may also achieve similar results.

Figure 10A:
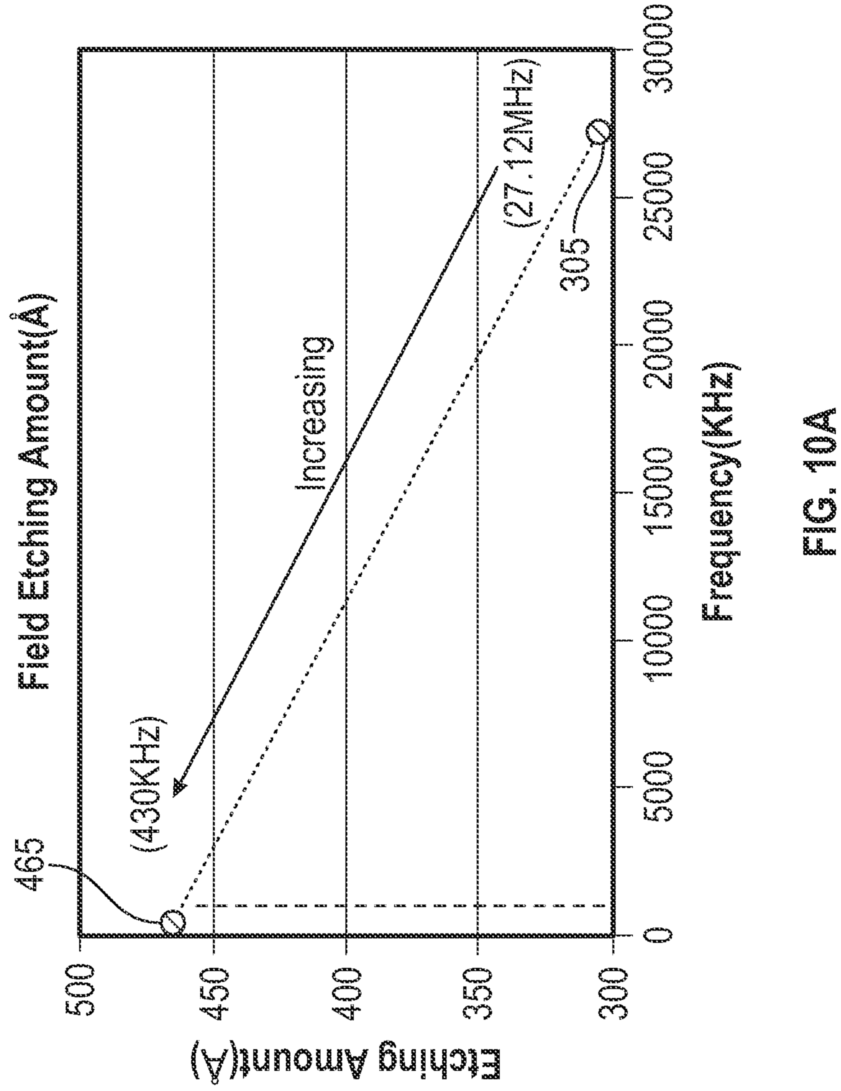
FIGS. 10A, 10B and 10C are additional example diagrams illustrating a relationship between an etching frequency and an amount of an ion bombardment effect during the etching procedure according to some embodiments.
Figure 10B:
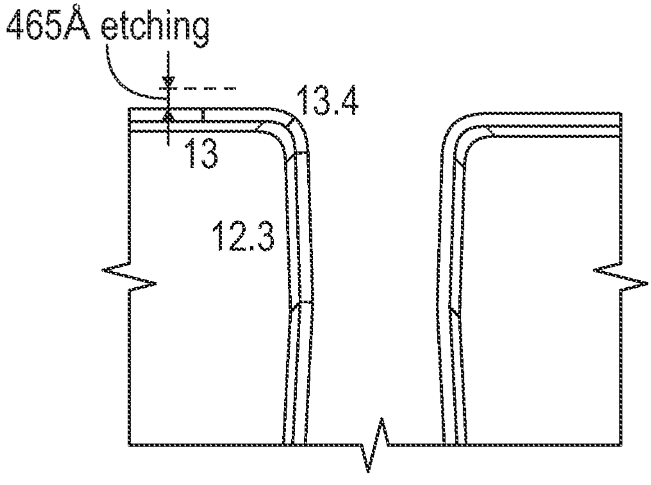
Figure 10C:
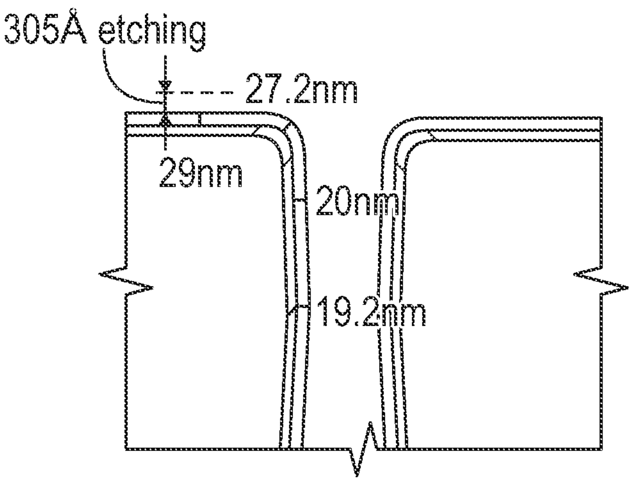

FIGS. 10A, 10B and 10C are example diagrams illustrating a relationship between a frequency and an amount of an ion bombardment effect during the etching procedure according to some embodiments. In FIG. 10A, the field etching amount (A) means the amount of a field portion (the thin film formed on the top portion of the pattern) being etched. FIG. 10A shows that the field etching amount (A) increases, as the etching frequency decreases. For example, the field portion is etched by about 465 Å when the about 430 KHz frequency is applied to the etchant, whereas the field portion is etched by about 305 Å when the about 27.12 MHz frequency is applied to the etchant.

Figure 11B:
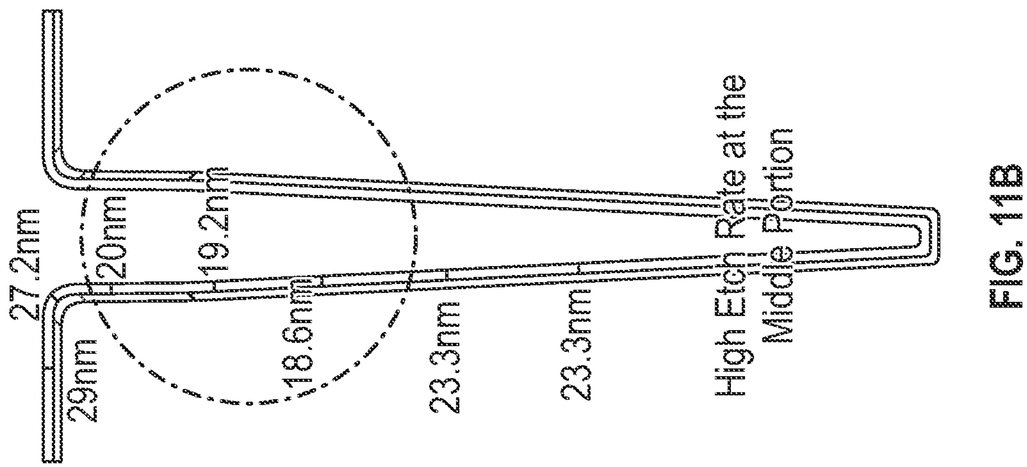
FIG. 11B is a diagram illustrating etch rates at different portions of a structure in a patterned semiconductor substrate according to a comparative example.
Figure 11A:
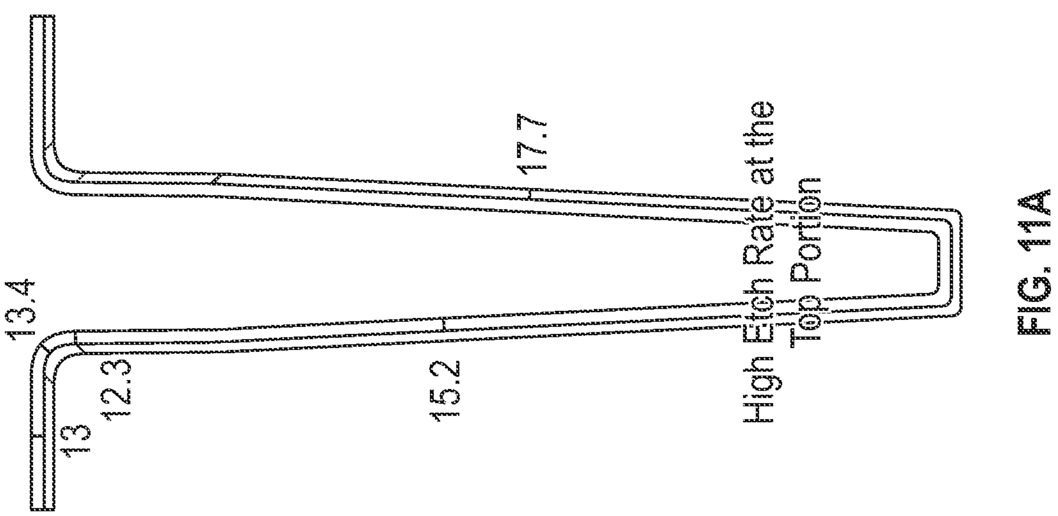
FIG. 11A is a diagram illustrating etch rates at different portions of a structure in a patterned semiconductor substrate according to some embodiments.

Referring to FIG. 10B, when the etchant activated with the low frequency (430 KHz) etches the thin film on the field portion of the pattern having an original thickness of about 595 Å (pre-etching thickness), about 465 Å is etched so that about 130 Å of the field portion is remaining after the etching (post-etching thickness), according to some embodiments (see also "13" (nm) at the upper left corner of FIG. 11A).

Referring to FIG. 10C, when the etchant activated with the high frequency (such as about 27.12 MHz) etches the thin film on the field portion of the pattern having the original thickness of about 595 Å, about 305 Å is etched so that a post-etching thickness of the field portion is about 290 Å, according to a comparative example (see also "29 nm" at the upper left corner of FIG. 11B).

FIG. 11A is a diagram illustrating etch rates at different portions of the pattern according to some embodiments. FIG. 11B is a diagram illustrating etch rates at different portions of the pattern according to a comparative example. FIG. 12 is a comparison diagram illustrating different etch rates at different portions of the pattern according to some embodiments and according to the comparative example.

Referring to FIGS. 11A and 12, when the etchant activated with the low frequency (such as about 430 KHz) is used, the remaining thickness of the thin film ($SiO_2$) on the top edge 1210 of the pattern is about 13.4 nm. In contrast, referring to FIGS. 11B and 12, when the etchant activated with the high frequency (such as about 27.12 MHz) is used, the remaining thickness of the thin film ($SiO_2$) on the top edge 1210 of the pattern is about 27.2 nm. That is, the thin film ($SiO_2$) on the top edge 1210 of the pattern is etched substantially more with the low frequency than with the high frequency.

Referring back to FIGS. 11A and 12, when the etchant activated with the low frequency (such as about 430 KHz) is used, the remaining thickness of a first portion 1220 of the thin film ($SiO_2$) formed on an upper portion of the trench 1212 (trench top) is about 12.3 nm. In contrast, referring back to FIGS. 11B and 12, when the etchant activated with the high frequency (such as about 27.12 MHz) is used, the remaining thickness of the first portion 1220 of the thin film ($SiO_2$) is about 20.0 nm. That is, the trench top is etched substantially more with the low frequency than with the high frequency. Furthermore, when the etchant activated with the low frequency (such as about 430 KHz) is used, the first portion 1220 of the thin film ($SiO_2$) may be etched more than a second portion (including but not limited to third and fourth portions 1230 and 1240; not labeled) of the thin film formed on a remaining surface of the trench 1212.

When the etchant activated with the low frequency (such as about 430 KHz) is used, the remaining thickness of the third portion 1230 of the thin film ($SiO_2$) formed on the middle portion of the trench 1212 (trench middle) is about 15.2 nm. In contrast, when the etchant activated with the high frequency (such as about 27.12 MHz) is used, the remaining thickness of the third portion 1230 of the thin film ($SiO_2$) formed on the trench middle is about 18.6 nm. That is, the trench middle is etched more with the low frequency than with the high frequency.

When the etchant activated with the low frequency (such as about 430 KHz) is used, the remaining thickness of the fourth portion 1240 of the thin film ($SiO_2$) formed on the low middle portion of the trench 1212 (trench middle-low) is about 17.7 nm. In contrast, when the etchant activated with the high frequency (27.12 MHz) is used, the remaining thickness of the fourth portion 1240 of the thin film ($SiO_2$) on the trench middle-low is about 23.3 nm. That is, the trench middle-low is etched substantially more with the low frequency than with the high frequency. Furthermore, when the etchant activated with the low frequency (such as about 430 KHz) is used, the third portion 1230 of the thin film ($SiO_2$) (trench middle) can be etched more than the fourth portion 1240 of the thin film ($SiO_2$) (trench middle-low).

The pattern 1214 may include a fifth portion 1216 of the thin film ($SiO_2$) formed on the top portion of the pattern 1214. The fifth portion 1216 may include a sixth portion 1210 of the thin film ($SiO_2$) formed on an edge of the top portion of the pattern 1214 and a seventh portion 1217 of the thin film ($SiO_2$) formed on a remaining top portion of the pattern 1214 (i.e., the fifth portion 1216 excluding the six portion 1210). The sixth portion 1210 of the thin film ($SiO_2$) may be etched less than the seventh portion 1217 of the thin film ($SiO_2$). The first portion 1220, the sixth portion 1210 and the seventh portion 1217 are significantly more etched with the etchant activated with the low frequency than with the high frequency. Furthermore, the thicknesses of the remaining $SiO_2$ film on these three upper portions 1217, 1210 and 1220 are respectively about 13 nm, about 13.4 nm and about 12.3 nm, which are substantially uniformly thinner than those of the comparative example (about 29 nm, about 27.2 nm and about 20.0 nm) (see FIG. 11A and FIG. 11B).

Referring back to the purge step (S7) of the etching procedure in FIG. 6, the remaining etchant gas and materials etched from the thin film may be purged with the carrier gas (Ar). The processing time of the purging step (S7) per unit cycle may be in a range of about 2.0 second to about 10.0 second, e.g., about 6.0 seconds. During the purge step (S7), the carrier gas (Ar) may continue to be provided to the reaction chamber at a gas flow rate in a range of about 5,000 sccm to about 10,000 sccm, e.g., about 7000 sccm. The cycle of S5-S7 may be repeated at least once, e.g., n cycles and n is a natural number. The sum of the number (m) of the deposition cycle and the number (n) of the etching cycle may be x (m+n=x).

Table 2 is a summary of example processing parameters and conditions used to perform the etching procedure (S5-S7). Again, the above described parameters and conditions, and those shown in Table 2 are merely examples, and other numbers or values can also be used.

TABLE 2

| A Process Condition of Etching Step of FIG. 6 (S5 to S7) | | |
|---|---|---|
| Temperature | | 50 to 600° C. (e.g., 400-550° C.) |
| Pressure (Torr) | | 1 to 5 Torr, e.g., 2 Torr |
| Gas flow rate (sccm) | $NF_3$ | 200 to 1,000 sccm, e.g., 300 sccm |
| | Purge Ar | 5,000 to 10,000 sccm, e.g., 7,000 sccm |
| Process time per unit cycle (sec) | Purge (S5) | 0.1 to 10.0 seconds, e.g., 6.0 seconds |
| | Plasma on (S6) | 5.0 to 15.0 seconds, e.g., 11.0 second |
| | Purge (S7) | 2.0 to 10.0 seconds, e.g., 6.0 seconds |
| Plasms condition | RF frequency | 3 to 13,560 KHz, e.g., 430 kHz |
| | RF power | 100 to 500 watts, e.g., 300 watts |

Figure 13B:
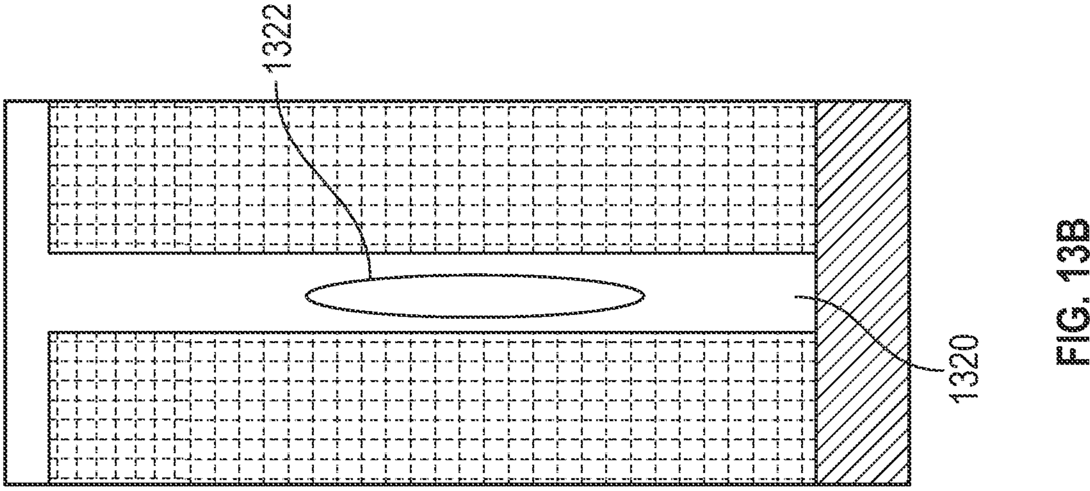
FIG. 13B illustrates a thin film having a seam therein according to a comparative example.
Figure 13A:
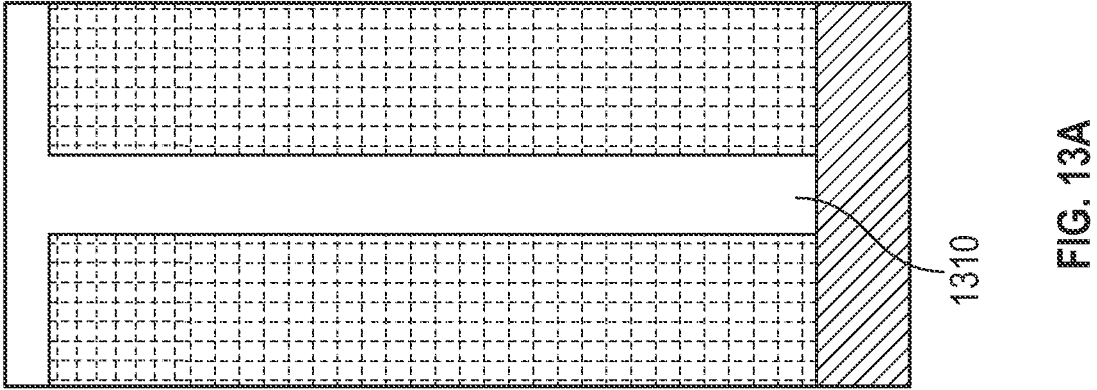
FIG. 13A illustrates a seam-free thin film filled in the gap according to some embodiments.

FIG. 13A illustrates a seam-free thin film 1310 filled in the gap according to some embodiments. The thin film shown in FIG. 13A can be prepared by repeating the high frequency based deposition procedure and the low frequency based etching procedure. As described above, according to the low frequency based etching procedure, an upper portion of the thin film can be more etched than the middle and lower portions of the thin film. That is, the width of the trench becomes wider as it moves from the lower portion to the upper portion. By repeating the deposition procedure and the etching procedure, the middle and lower portions of the trench can be filled first with the thin film and then the upper portion of the trench is filled so that a thin film substantially free of voids/seams can be formed as shown in FIG. 13A.

FIG. 13B illustrates a thin film 1320 having a seam 1322 therein according to a comparative example. The thin film shown in FIG. 13B is prepared by repeating the low frequency based deposition procedure and the high frequency based etching procedure. As described above, according to the high frequency based etching procedure, a middle portion of the thin film is etched more than the upper and lower portions of the thin film. That is, the width of the trench is widest in the middle portion of the trench. By repeating the deposition procedure and the etching procedure, the upper portion of the trench is filled first with the thin film and the gap of the trench is closed from the top, causing some voids and/or seams formed in the middle portion of the trench as shown in FIG. 13B.

Figure 14:
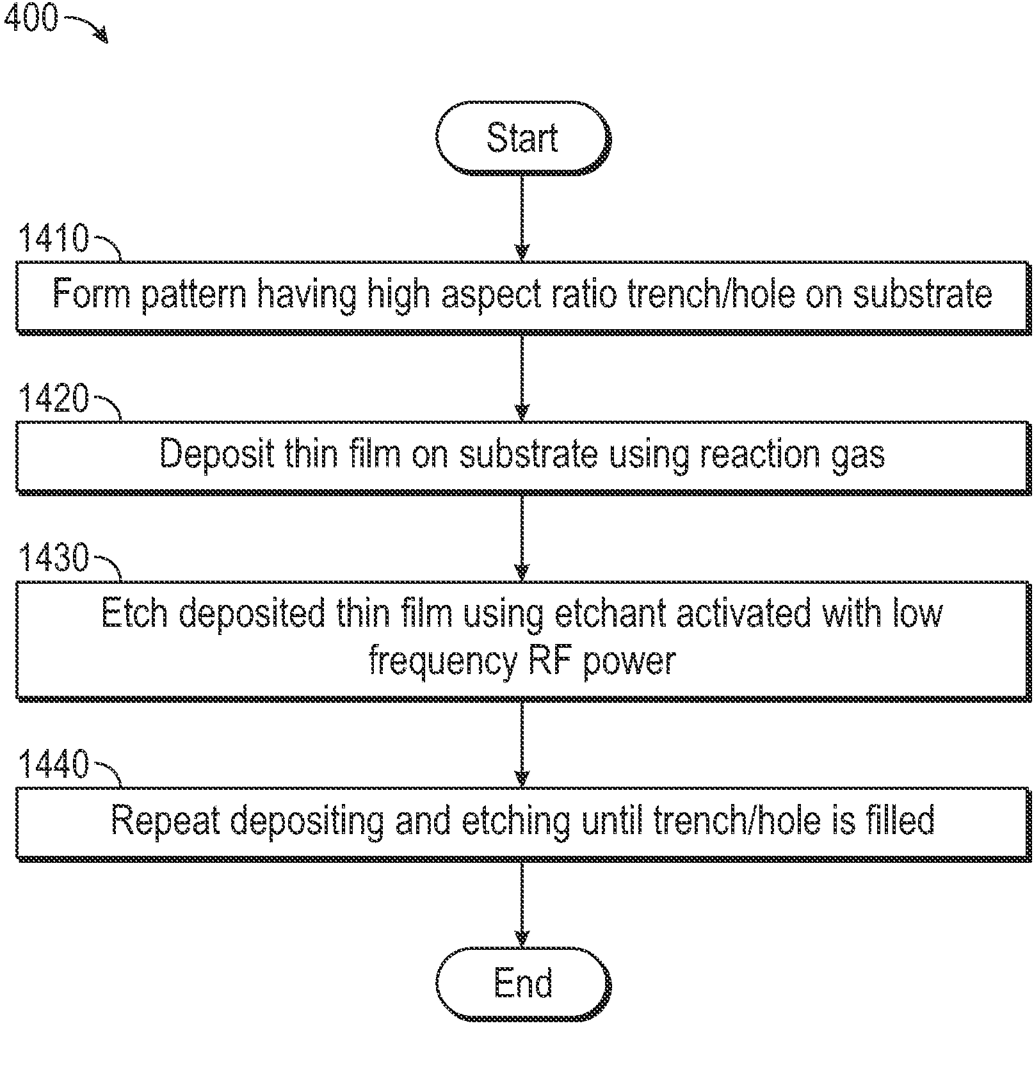
FIG. 14 illustrates another example method of filling a gap in a semiconductor pattern in a semiconductor manufacturing process according to some embodiments.

FIG. 14 illustrates another example method 1400 of filling a gap in a semiconductor pattern in a semiconductor manufacturing process according to some embodiments. In step 1410, a semiconductor pattern having a high aspect ratio trench/hole may be formed on a substrate. As described above, the high aspect ratio may be at least about 20:1.

In step 1420, a thin film may be deposited by a vapor deposition process such as ALD, PEALD or PECVD using one or more vapor phase reactants. For example, the thin film may be deposited on the substrate including the semiconductor pattern using a reaction gas (deposition procedure). The reaction gas may include one or more reaction gases. In some embodiments, the reaction gas may be activated with a first RF power having a first frequency or a second RF power having a second frequency. The reaction gas may include, but is not limited to, $O_2$, $O_3$, $H_2O$, $NO_2$, $N_2O$, or a combination thereof. The first frequency may be in a range of about 100 kHz to about 3,000 MHz. The first RF power may be in a range of about 100 watts to about 20,000 watts. The second frequency may be in a range of about 3 kHz to about 13,560 kHz. The second RF power may be in a range of about 100 watts to about 500 watts. In other embodiments, the reaction gas may be activated with a third RF power, e.g., higher than the first RF power or lower than the second RF power. The third RF power may have a frequency higher than the first frequency or lower than the second frequency. The main difference between the method 1400 of FIG. 14 and the method 500 of FIG. 5 is that the deposition procedure in FIG. 5 is performed with the first RF power having the first frequency higher than the second frequency used to activate the etchant, whereas the deposition procedure in FIG. 14 may be performed with any suitable RF power having any suitable frequency that can activate the reaction gas. That is, a frequency used to activate the reaction gas in the deposition procedure in FIG. 14 may not need to be higher than a frequency used to activate the etchant.

In step 1430, the deposited thin film may be etched using an etchant activated with a low RF power having a low frequency (etching procedure). The low RF power may be in a range of about 100 watts to about 500 watts. The low frequency may be the same as the second frequency described above, i.e., a range of about 3 kHz to about 13,560 kHz. The etchant may include, but is not limited to, $NF_3$, $ClF_3$, $F_2$, $SF_6$, $CF_4$, or a combination thereof.

In step 1440, a cycle of the deposition procedure (step 1420) and the etching procedure (step 1430) may be repeated, for example, N times (N is a natural number) until the trench and/or hole is filled with the thin film. The number of repetitions may vary depending on one or more of the above described processing parameters and/or conditions.

Figure 15:
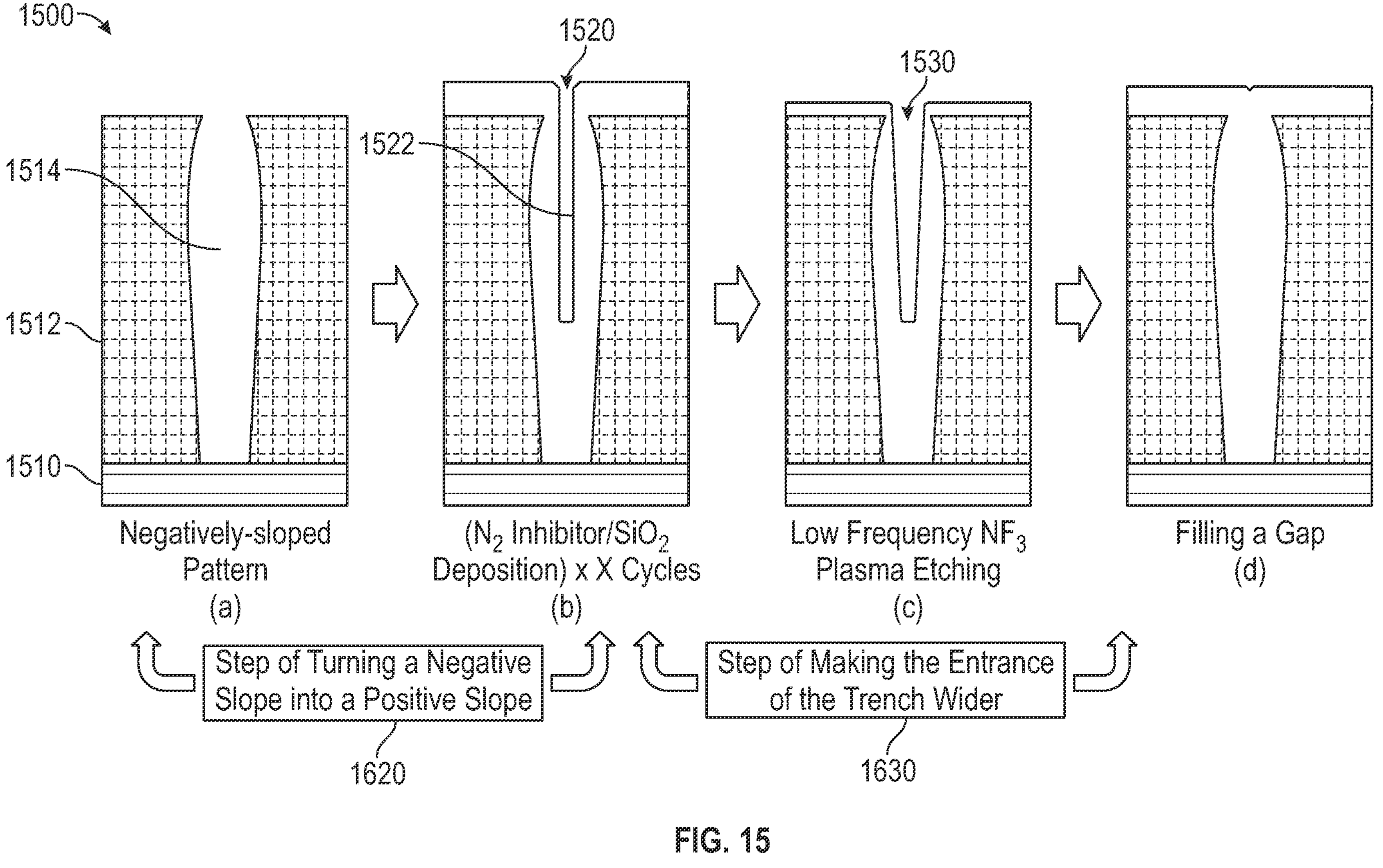
FIG. 15 illustrates an example process of filling a gap in a negatively-sloped semiconductor pattern in a semiconductor manufacturing process according to some embodiments.
Figure 16:
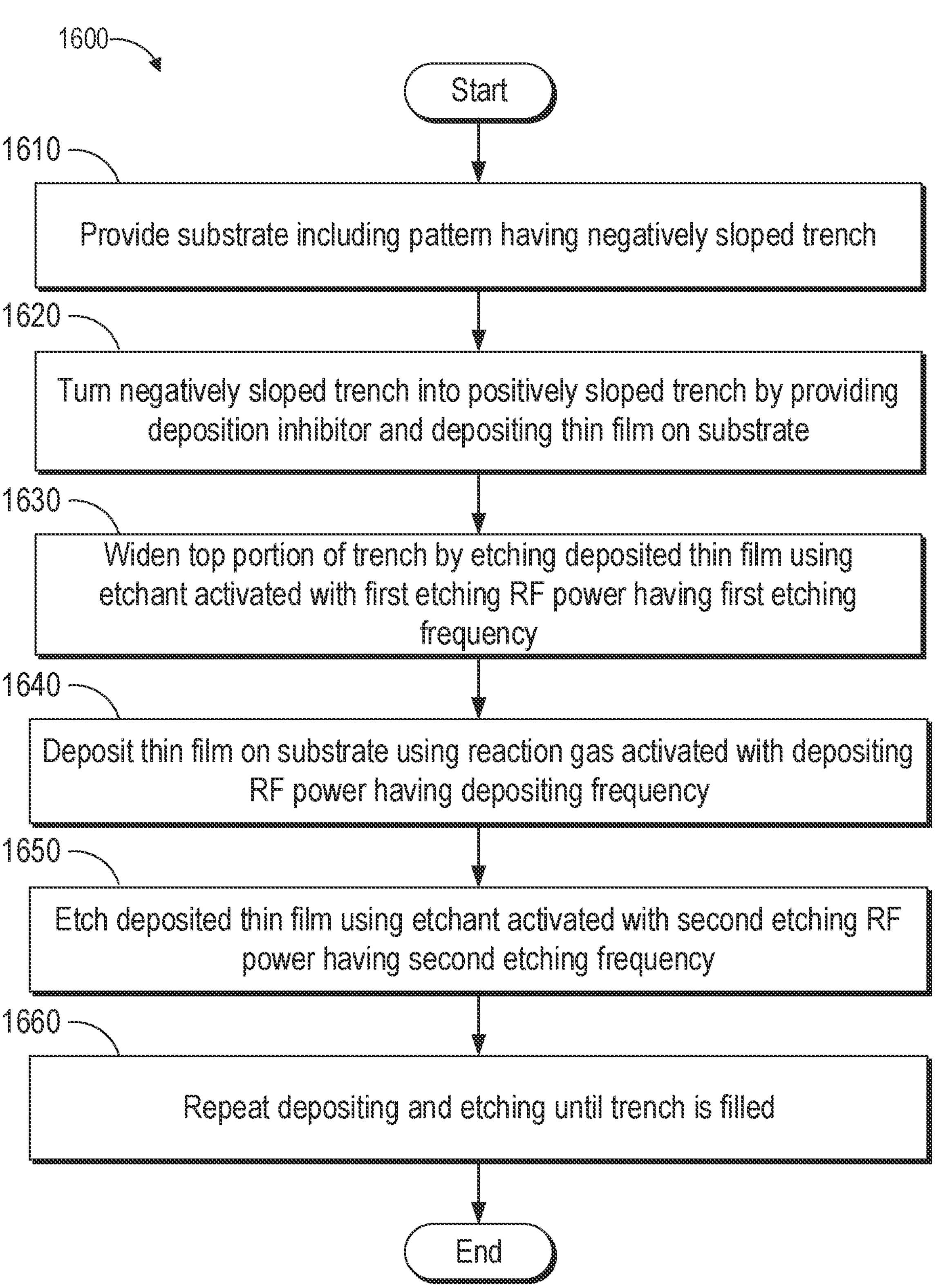
FIG. 16 illustrates an example method of filling a gap in the negatively-sloped semiconductor pattern of FIG. 15 according to some embodiments.

FIG. 15 illustrates an example process 1500 of filling a gap in a semiconductor pattern having a negatively-sloped trench in a semiconductor manufacturing process according to some embodiments. FIG. 16 illustrates an example method 1600 of filling a gap in the semiconductor pattern having the negatively-sloped trench of FIG. 15 according to some embodiments. Referring to FIG. 15, a semiconductor pattern 1512 may have a negatively-sloped trench 1514 that has a width smaller in a top portion than in upper and middle portions thereof. The negatively-sloped trench 1514 can be filled with a thin film 1522 that is substantially free of voids and/or seams.

The gap filling method 1600 of FIG. 16 will be described with reference to FIG. 15. In step 1610, a substrate 1510 including a semiconductor pattern 1512 having a negatively-sloped trench 1514 may be provided on a reactor (not shown). For example, the substrate may be placed on a susceptor or a heating block inside the reactor (see "(a)" in FIG.

In step 1620, the negatively-sloped trench 1514 may be turned into a positively sloped trench 1520 by providing a deposition inhibitor while depositing a thin film 1522 on the semiconductor pattern 1512 (see "(b)" in FIG. 15). In some embodiments, the deposition inhibitor and the thin film can be simultaneously or substantially simultaneously provided. In other embodiments, a timing for supplying the deposition inhibitor and a timing for supplying the thin film can at least partially overlap with each other. The deposition inhibitor may suppress or reduce thin film deposition on the top portion of the trench 1514 so that the thin film is deposited less on the top portion than the remaining portion of the trench 1514. In some embodiments, the deposition inhibitor may be supplied to the pattern 1512 while the thin film is deposited on the pattern 1512. The deposition inhibitor may include, for example, a $N_2$ (Nitrogen) inhibitor. A $N_2$ inhibitor has superior bottom up-gap-fill characteristics. Other deposition inhibitors having good bottom up-gap-fill characteristics such as acetylacetone or polymer can also be used. The thin film may include $SiO_2$.

The step (b) in FIG. 15 may be repeated X times (X cycles and X is a natural number) until the negatively sloped trench 1514 is converted into a positively sloped trench 1520 (see "(b)" in FIG. 15). The conversion of the negatively sloped trench 1514 into the positively sloped trench 1520 may be advantageous in a gap-filling process, since a thin film having substantially free of voids and/or seams can be formed in the positively sloped trench 1520 compared to the negatively sloped trench 1514. For example, when a thin film is deposited in a negatively sloped trench, more voids and/or seams can be generated. The deposition procedure may use a reaction gas activated with any suitable frequency RF power described above.

In step 1630, the top portion of the positively sloped trench 1520 may be widened by etching the deposited thin film using an etchant activated with a first etching RF power having a first etching frequency (see "(c)" in FIG. 15). In some embodiments, the first etching frequency may be low frequency. In some embodiments, the first etching frequency is in a range of about 3 kHz to about 13,560 kHz. In some embodiments, the first etching frequency is in a range of about 100 kHz to about 5,000 kHz. In some embodiments, the first etching RF power is in a range of about 100 watts to about 500 watts. The etchant may include, but is not limited to, $NF_3$, $ClF_3$, $F_2$, $SF_6$, $CF_4$, or a combination thereof.

In step 1640, a thin film may be deposited on a top-widened trench 1530 using a reaction gas activated with a depositing RF power having a depositing frequency. Since the trench has a widened top, the thin film can be filled on the bottom and middle portion of the trench 1530 prior to filling the top portion described above. This way, a thin film having substantially free of voids and/or seams can be formed in the trench 1530. The reaction gas may be activated with any frequency RF power that can activate the reaction gas. The depositing frequency may be any frequency that can activate the reaction gas. In some embodiments, the depositing frequency is lower than the first etching frequency. In some embodiments, the depositing frequency is higher than the first etching frequency. In some embodiments, the depositing frequency is the same as the first etching frequency. In some embodiments, the depositing frequency may be high frequency. In some embodiments, the depositing frequency may be low frequency. The reaction gas may include, but is not limited to, $O_2$, $O_3$, $H_2O$, $NO_2$, $N_2O$, or a combination thereof.

In step 1650, the deposited thin film may be etched using an etchant activated with a second etching RF power having a second etching frequency (or low frequency RF power). In some embodiments, the second etching frequency may be low frequency. In some embodiments, the second etching frequency may be the same as the first etching frequency in step 1630. In some embodiments, the second etching frequency may be different from the first etching frequency in step 1630. In some embodiments, the second etching frequency is in a range of about 3 kHz to about 13,560 kHz. In some embodiments, the second etching frequency is in a range of about 100 kHz to about 5,000 kHz. In some embodiments, the second etching RF power is in a range of about 100 watts to about 500 watts. As described above, an etchant activated with a low frequency RF power may etch a thin film more on an upper surface of the trench than a middle surface and a lower surface of the trench so that the thin film can be filled on the bottom and middle surfaces of the trench prior to filling the top surface thereof. Again, the combination of the low frequency etching and the deposition (either by high frequency or low frequency RF power) can more efficiently form a thin film substantially free of voids and/or seams in the trench 1530. In step 1660, a cycle of the step 1640 and the step 1650 may repeat until the trench 1530 is filled with the thin film (see "(d)" in FIG. 15).

Other Variations

In some embodiments, a substantial amount of reaction gas radicals can also be generated without using a high frequency RF power on a deposition procedure. For example, $O_2$ can be used as a reaction gas in a high temperature environment, for example, about 700° C. without applying a high frequency RF power in a deposition procedure. Furthermore, $O_3$ can be used as a reaction gas without generating a plasma gas (e.g., $O_2$+high frequency RF power).

In some embodiments, an increased ion bombardment effect may be realized without using a low frequency RF power in the etching procedure. For example, during the etching procedure, an etchant may be used in a lower pressure environment, for example, a pressure lower than about 1 Torr. The lower pressure can make the mean free path (MFP) between gas particles longer so that a lesser amount of etchant radicals (e.g., F radicals) can collide with other gas particles, resulting in an increased ion bombardment effect.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a sub combination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products. For example, any of the components for an energy storage system described herein can be provided separately, or integrated together (e.g., packaged together, or attached together) to form an energy storage system.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result.

The scope of the present disclosure is not intended to be limited by the specific disclosures of embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

While certain embodiments have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

What is claimed is:

1. A method of filling a gap in a three-dimensional structure on a substrate, the method comprising:

depositing a thin film for filling the gap in the three-dimensional structure using a reaction gas activated with a first radio frequency (RF) power having a first frequency to form a deposited thin film;

performing an etching process, the etching process comprising an etching step and a purge step after the etching step, wherein the etching step comprises providing an etchant comprising fluorine and activating the etchant with a second RF power having a second frequency lower than the first frequency, wherein the deposited thin film is etched during the etching step, wherein the etchant is continuously provided during the etching step, wherein the second frequency is in a range of about 3 kHz to about 1,000 kHz; and repeating a cycle of the depositing and the etching at least once to form a thin film pattern that fills the gap to a level above a top surface the structure, wherein the deposited thin film formed on the top surface of the structure and a top portion of the gap are etched more than the deposited thin film formed on a middle surface of the gap and a lower surface of the gap, and wherein a ratio of voids to material in a volume of the thin film is 0.005 or less.

2. The method of claim 1, wherein the reaction gas comprises at least one of $O_2$, $O_3$, $H_2O$, $NO_2$, $N_2O$, or any combination thereof.

3. The method of claim 1, wherein the first frequency is in a range of about 500 MHz to about 3,000 MHz.

4. The method of claim 1, wherein the first RF power is in a range of about 1,000 watt to about 3,000 watt.

5. The method of claim 1, wherein the deposited thin film formed on the middle surface of the gap is etched more than the deposited thin film formed on the lower surface of the gap.

6. The method of claim 1, wherein the second RF Power is in a range of about 100 watts to about 500 watts.

7. The method of claim 1, wherein the first frequency is in a range of about 27.12 MHz to about 100 MHz, and wherein the second frequency is in a range of about 100 kHz to about 1,000 kHz.

8. The method of claim 1, wherein the etchant comprises at least one of $F_2$, $CF_4$, or any combination thereof.

9. The method of claim 1, wherein depositing the thin film comprises providing a precursor comprises one or more of an aminosilane, an iodosilane, or a silicon halide.

10. The method of claim 1, further comprising supplying an inhibitor activated with a plasma gas before depositing the thin film, wherein the inhibitor comprises nitrogen.

11. The method of claim 1, wherein depositing the thin film comprises forming a plasma from a gas consisting of Ar and one or more of $O_2$, $O_3$, $H_2O$, $NO_2$, and $N_2O$, and wherein the etchant consists of one or more of $NF_3$, $ClF_3$, $F_2$, $SF_6$, and $CF_4$.

12. The method of claim 1, wherein the method is performed at a pressure in the range of about 1 Torr to about 5 Torr.

13. The method of claim 1, wherein the reaction gas is continuously provided during the step of depositing the thin film.

14. The method of claim 1, wherein the gap has an aspect ratio of at least about 20:1.

15. The method of claim 14, wherein the cycle of the depositing and the etching is repeated 1-40 times when a width of the gap is about 100 nm or less.

16. A method of filling a gap in a three-dimensional structure over a semiconductor substrate, the method comprising:

depositing a thin film comprising $SiO_2$ for filling the gap in the three-dimensional structure by a vapor deposition process comprising contacting the three-dimensional structure with a reaction gas activated with a first radio frequency (RF) power having a first frequency to form a deposited thin film;

etching the deposited thin film using an etchant activated with a second RF power having a second frequency in a range of about 3 kHz to about 1,000 kHz, wherein the second frequency is different from the first frequency, wherein the etchant comprises fluorine; and repeating a cycle of the depositing and the etching at least once until the gap is filled with the thin film to form a thin film pattern.

17. The method of claim 13, wherein the depositing comprises activating the reaction gas with the first frequency in a range of about 100 kHz to about 3,000 MHz.

18. The method of claim 16, further comprising continuously flowing a carrier gas through the cycle of the depositing and the etching.

19. The method of claim 16, wherein depositing the thin film comprises forming a plasma from a gas consisting of Ar and one or more of $O_2$, $O_3$, $H_2O$, $NO_2$, and $N_2O$, and wherein the etchant consists of one or more of $NF_3$, $ClF_3$, $F_2$, $SF_6$, and $CF_4$.

20. The method of claim 16, wherein the deposited thin film formed on a middle surface of the gap is etched more than the deposited thin film formed on a lower surface of the gap.

* * * * *